US012265130B2

(12) United States Patent
Shigemori et al.

(10) Patent No.: US 12,265,130 B2
(45) Date of Patent: Apr. 1, 2025

(54) MONITORING SYSTEM

(71) Applicant: DENSO CORPORATION, Kariya (JP)

(72) Inventors: Shogo Shigemori, Kariya (JP);
Tatsuhiro Numata, Kariya (JP);
Tetsuya Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 418 days.

(21) Appl. No.: 17/896,200

(22) Filed: Aug. 26, 2022

(65) Prior Publication Data

US 2023/0064107 A1 Mar. 2, 2023

(30) Foreign Application Priority Data

Aug. 30, 2021 (JP) ................................. 2021-139726

(51) Int. Cl.
*G01R 31/371* (2019.01)
*G01R 31/396* (2019.01)
(Continued)

(52) U.S. Cl.
CPC ......... *G01R 31/371* (2019.01); *G01R 31/396* (2019.01); *H02J 7/0048* (2020.01); *H04W 84/20* (2013.01)

(58) Field of Classification Search
CPC ............................ G01R 31/371; G01R 31/396; G01R 31/3648; G01R 31/392; G01R 31/36;
(Continued)

(56) References Cited

U.S. PATENT DOCUMENTS 11,203,266 B2 * 12/2021 Ikui .......................... B60L 53/62
2007/0257642 A1 * 11/2007 Xiao .................... H02J 7/00308
320/134
(Continued)

FOREIGN PATENT DOCUMENTS

| CA | 2944789 C | * | 9/2017 | ............... G01D 4/00 |
| CN | 106846879 A | * | 6/2017 | ............. G08G 1/123 |

(Continued)

OTHER PUBLICATIONS

U.S. Appl. No. 17/896,217, filed Aug. 26, 2022, Shigemori et al.
(Continued)

*Primary Examiner* — Jeffrey P Aiello
(74) *Attorney, Agent, or Firm* — Posz Law Group, PLC

(57) ABSTRACT

A monitoring system includes monitoring devices provided in a monitored device, and a controller that wirelessly communicates with the monitoring devices to acquire monitoring information. In an operating state of the monitored device, the controller and the monitoring devices establish individual connections in which the controller acting as a communication master performs wireless communication with each of the monitoring devices acting as communication slaves. In a non-operating state of the monitored device, the controller and the monitoring devices maintain communication between the controller and the monitoring devices by establishing a sequential connection. In the sequential connection, the controller acting as a communication master performs wireless communication with one of the monitoring devices acting as a communication slave, and one of the monitoring devices, in sequence, acting as a communication master performs wireless communication with another one of the monitoring devices acting as a communication slave.

13 Claims, 13 Drawing Sheets

(51) Int. Cl.
*H02J 7/00* (2006.01)
*H04W 84/20* (2009.01)

(58) Field of Classification Search
CPC .............. G01R 31/367; G01R 31/3835; G01R 19/2513; G01R 19/16542; G01R 21/00; G01R 22/10; H02J 7/00032; H02J 7/0047; H02J 7/0048; H02J 7/00047; H02J 7/00036; H02J 7/00041; H02J 7/0013; H02J 7/005; H02J 3/14; H02J 13/00002; H02J 13/00001; H02J 13/00006; H02J 13/00034; H02J 13/0005; H04W 84/20; H04W 4/70; H04W 4/80; H04W 4/38; H04W 24/00; H04L 67/12
USPC .............. 73/865.8; 320/134; 340/539.1, 658; 455/3.01, 414.1; 700/275, 1, 83; 701/1, 701/33.7; 702/63, 188, 182, 183, 189, 702/130, 104, 127, 62, 44, 60, 1, 179, 702/185, 64, 61, 122
See application file for complete search history.

(56) References Cited

U.S. PATENT DOCUMENTS

| | | | | |
|---|---|---|---|---|
| 2008/0290833 A1* | 11/2008 | Hayashi | .............. | H01M 10/482 320/137 |
| 2013/0158686 A1* | 6/2013 | Zhang | .................. | G01C 22/006 700/91 |
| 2014/0354291 A1* | 12/2014 | Kikuchi | .............. | H01M 10/441 324/434 |
| 2015/0134167 A1* | 5/2015 | Won | ........................ | B60L 55/00 701/29.3 |
| 2015/0239365 A1* | 8/2015 | Hyde | ...................... | B60L 58/26 701/2 |
| 2015/0268308 A1* | 9/2015 | Nakayama | .............. | B60L 58/16 702/50 |
| 2016/0268642 A1* | 9/2016 | Yamazoe | ............ | H01M 10/425 |
| 2021/0162867 A1* | 6/2021 | Clay | .................... | H01M 16/00 |
| 2022/0393624 A1* | 12/2022 | Nagata | ...................... | H02P 7/04 |

FOREIGN PATENT DOCUMENTS

| | | | | | |
|---|---|---|---|---|---|
| CN | 106940935 A | * | 7/2017 | .............. | G08G 1/123 |
| CN | 108092368 B | * | 3/2020 | .............. | B60K 35/00 |

OTHER PUBLICATIONS

U.S. Appl. No. 17/896,198, filed Aug. 26, 2022, Shigemori et al.
U.S. Appl. No. 17/896,417, filed Aug. 26, 2022, Ohata et al.
U.S. Appl. No. 17/896,261, filed Aug. 26, 2022, Nakagawa et al.
U.S. Appl. No. 17/896,179, filed Aug. 26, 2022, Ohata et al.
U.S. Appl. No. 17/896,186, filed Aug. 26, 2022, Moriya et al.
U.S. Appl. No. 17/896,239, filed Aug. 26, 2022, Shigemori et al.
U.S. Appl. No. 17/896,203, filed Aug. 26, 2022, Nakata et al.

* cited by examiner

MONITORING SYSTEM

CROSS REFERENCE TO RELATED APPLICATION

The present application is based on and incorporates herein by reference Japanese Patent Application No. 2021-139726 filed on Aug. 30, 2021.

TECHNICAL FIELD

The present disclosure relates to a monitoring system for monitoring a monitored device.

BACKGROUND

A battery control system includes battery-cell management devices and an assembled-battery management device. The battery-cell management devices each acquire a measurement result regarding states of charge of battery cells of a corresponding battery cell group. The assembled-battery management device performs wireless communication with the battery-cell management devices.

SUMMARY

According to an aspect of the present disclosure, a monitoring system includes monitoring devices provided in a monitored device and monitoring the monitored device, and a controller configured to wirelessly communicate with the monitoring devices to acquire monitoring information of the monitored device from the monitoring devices. The monitored device is switchable between an operating state and a non-operating state. In the operating state of the monitored device, the controller and the monitoring devices establish individual connections in which the controller acting as a communication master performs wireless communication with each of the monitoring devices acting as communication slaves. In the non-operating state of the monitored device, the controller and the monitoring devices maintain communication between the controller and the monitoring devices by establishing a sequential connection. In the sequential connection, the controller acting as a communication master performs wireless communication with one of the monitoring devices acting as a communication slave, and one of the monitoring devices, in sequence, acting as a communication master performs wireless communication with another one of the monitoring devices acting as a communication slave.

BRIEF DESCRIPTION OF DRAWINGS

The details of one or more embodiments are set forth in the accompanying drawings and the description below. Other features and advantages will be apparent from the description and drawings, and from the claims.

DETAILED DESCRIPTION

Figure 1:
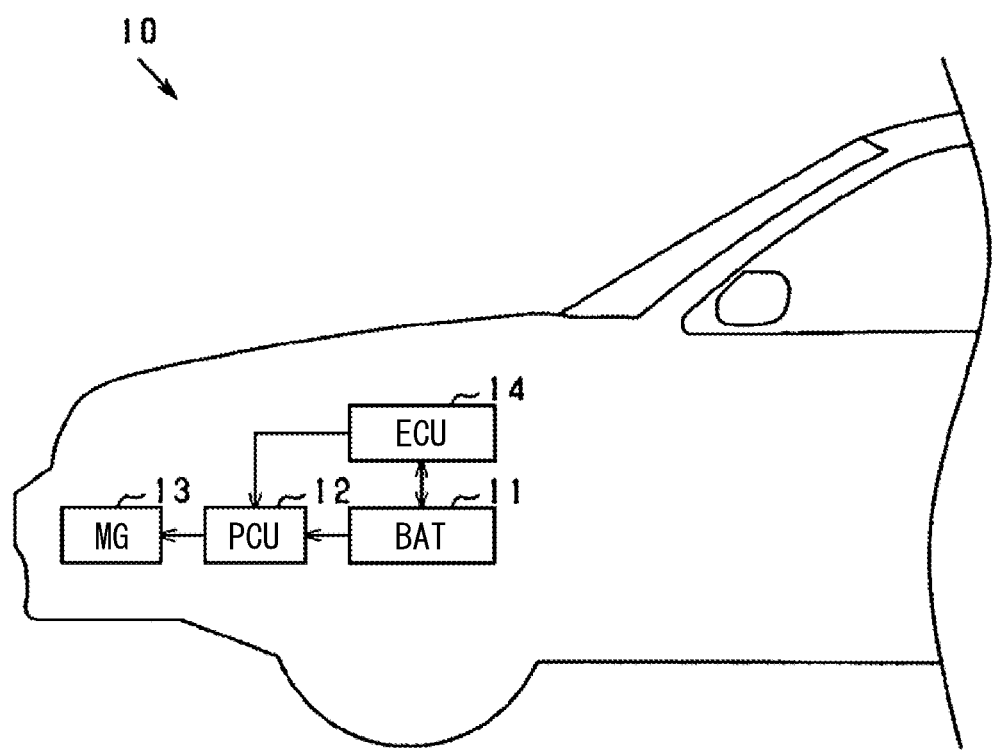
FIG. 1 is a diagram illustrating a vehicle including a battery pack.

To begin with, examples of relevant techniques will be described. A battery control system according to a comparative example includes battery-cell management devices and an assembled-battery management device. The battery-cell management devices each acquire a measurement result regarding states of charge of battery cells of a corresponding battery cell group. The assembled-battery management device performs wireless communication with the battery-cell management devices.

In the battery control system described above, when a main switch of a vehicle is turned off, an assembled battery becomes into a non-operating state in which power need not be supplied from the assembled battery to an in-vehicle system, and the wireless communication between the assembled-battery management device and each battery-cell management device is disabled. When the main switch of the vehicle is turned on and the assembled battery becomes into an operating state, the communication between the assembled-battery management device and each battery-cell management device is required to be re-established. However, since it may take time to establish the communication, the assembled-battery management device and each battery cell management device cannot start communication promptly at the time of the assembled battery becoming into the operating state.

Hence, the present inventors have conducted a study about maintaining communication between each of monitoring devices that monitors a monitored device such as the assembled battery described above and a controller communicatively connected to the monitoring devices even in a non-operating state of the monitored device. Maintaining of the communication between the controller and the monitoring devices in the non-operating state of the monitored device enables a prompt start of communication between the controller and the monitoring devices regarding monitoring information of the monitored device at the time of the monitored device becoming into an operating state.

However, if the communication in the operating state of the monitored device in which the controller individually communicates with each of the monitoring devices is maintained even in the non-operating state of the monitored device, a power consumption by the controller may become larger than a power consumption by the each individual monitoring device. In a case where a power supply for the controller and a power supply for the monitoring devices are different, the difference in power consumption may become a concern.

In contrast, according to the present disclosure, a monitoring system is capable of reducing power consumption in a controller while maintaining communication between the controller and monitoring devices even in a non-operating state of a monitored device.

According to an aspect of the present disclosure, a monitoring system includes monitoring devices provided in a monitored device and monitoring the monitored device, and a controller configured to wirelessly communicate with the monitoring devices to acquire monitoring information of the monitored device from the monitoring devices. The monitored device is switchable between an operating state and a non-operating state. In the operating state of the monitored device, the controller and the monitoring devices establish individual connections in which the controller acting as a communication master performs wireless communication with each of the monitoring devices acting as communication slaves. In the non-operating state of the monitored device, the controller and the monitoring devices maintain communication between the controller and the monitoring devices by establishing a sequential connection. In the sequential connection, the controller acting as a communication master performs wireless communication with one of the monitoring devices acting as a communication slave, and one of the monitoring devices, in sequence, acting as a communication master performs wireless communication with another one of the monitoring devices acting as a communication slave.

As described above, in the non-operating state of the non-monitoring device, the controller acts as the communication master for one of the monitoring devices. Regarding remaining ones of the monitoring devices, in sequence, one of the monitoring devices acts as a communication master for another one of the monitoring devices. As described above, by switching a mode of the communication between the controller and the monitoring devices, it is possible to reduce power consumption in the controller while maintaining communication between the controller and the monitoring devices.

Hereinafter, multiple embodiments will be described with reference to the drawings. The same or corresponding elements in the embodiments are assigned the same reference numerals, and descriptions thereof will not be repeated. When only a part of the configuration is described in one embodiment, the other parts of the configuration may employ descriptions about a corresponding configuration in another embodiment preceding the one embodiment. Further, not only the combinations of the configurations explicitly shown in the description of the respective embodiments, but also the configurations of multiple embodiments can be partially combined even when they are not explicitly shown as long as there is no difficulty in the combination in particular.

First Embodiment

First, a configuration of a vehicle on which a battery management system as a monitoring system according to the present embodiment is mounted will be described with reference to FIG. 1. Particularly, a vehicle related to a battery pack including the battery management system will be described. FIG. 1 is a diagram illustrating a schematic configuration of the vehicle. The vehicle is an electric vehicle such as a battery electric vehicle (BEV), a hybrid electric vehicle (HEV), or a plug-in hybrid electric vehicle (PHEV). The battery management system can also be applied to a mobile body other than vehicles, and, for example, can be applied to a flying body like a drone, a ship, a construction machine, or an agricultural machine. The battery management system can also be applied to stationary batteries (storage batteries) for home use, business use, and the like.

<Vehicle>

As shown in FIG. 1, a vehicle 10 includes a battery pack (BAT) 11, a PCU 12, an MG 13, and an ECU 14. "PCU" is an abbreviation for "Power Control Unit". "MG" is an abbreviation of "Motor Generator". "ECU" is an abbreviation of "Electronic Control Unit".

The battery pack 11 includes an assembled battery 20 described later, and provides a chargeable and dischargeable DC voltage source. The battery pack 11 supplies electric power to an electric load of the vehicle 10. For example, the battery pack 11 supplies the electric power to the MG 13 through the PCU 12. The battery pack 11 is charged through the PCU 12. The battery pack 11 may be referred to as a main machine battery.

For example, as illustrated in FIG. 1, the battery pack 11 is disposed in a front compartment of the vehicle 10. The battery pack 11 may be disposed in a rear compartment, under a seat, under a floor, or the like. For example, in the case of a hybrid electric vehicle, a compartment in which an engine is disposed may be referred to as an engine compartment or an engine room.

A temperature of the battery pack 11 is adjusted by air flowing into the vehicle 10 running and cooling air supplied from a fan mounted on the vehicle 10. The temperature of the battery pack 11 may be adjusted by a cooling liquid circulating inside the vehicle 10. The temperature adjustment described above reduces an excessive temperature change of the battery pack 11. The battery pack 11 may be simply coupled to a member having a large heat capacity, such as a body of the vehicle 10, in a thermally conductive manner.

The PCU 12 executes bidirectional power conversion between the battery pack 11 and the MG 13 in accordance with a control signal from the ECU 14. The PCU 12 may be referred to as a power converter. The PCU 12 can include an inverter and a converter. The converter is disposed in an energization path between the battery pack 11 and the inverter. The converter has a function of raising and lowering the DC voltage. The inverter converts the DC voltage raised by the converter into an AC voltage such as a three-phase AC voltage, and outputs the AC voltage to the MG 13. The inverter converts the generated power of the MG 13 into a DC voltage and outputs the DC voltage to the converter. The converter charges the assembled battery 20 of the battery pack 11 with a DC voltage obtained by lowering of the DC voltage output from the inverter.

The MG 13 is an AC rotating machine such as a three-phase AC synchronous motor in which a permanent magnet is embedded in a rotor. The MG 13 functions as a drive source for running of the vehicle 10, that is, an electric motor. The MG 13 is driven by the PCU 12 to generate a rotational driving force. The driving force generated by the MG 13 is transmitted to a drive wheel. The MG 13 functions as a generator at the time of braking of the vehicle 10 and performs regenerative power generation. The generated power of the MG 13 is supplied to the battery pack 11 through the PCU 12 and stored in the assembled battery 20 inside the battery pack 11.

The ECU 14 includes a computer including a processor, a memory, an input/output interface, a bus that connects these components. The processor is hardware for arithmetic processing. The processor includes, for example, a CPU as a core. "CPU" is an abbreviation for "Central Processing Unit". The memory is a non-transitory tangible storage medium that non-transiently stores computer-readable programs, data, and the like. The memory stores various programs to be executed by the processor.

The ECU 14 acquires information regarding the assembled battery 20 from the battery pack 11, for example, and controls the PCU 12 to control driving of the MG 13 and charging and discharging of the battery pack 11. The ECU 14 may acquire information such as a voltage, a temperature, a current, an SOC, and an SOH of the assembled battery 20 from the battery pack 11. The ECU 14 may acquire battery information such as a voltage, a temperature, and a current of the assembled battery 20 and calculate an SOC and an SOH. "SOC" is an abbreviation for "State Of Charge". "SOH" is an abbreviation for "State Of Health".

The processor of the ECU 14 executes, for example, multiple instructions included in a PCU control program stored in the memory. As a result, the ECU 14 constructs multiple functional units for controlling the PCU 12. As described above, in the ECU 14, the program stored in the memory causes the processor to execute the multiple instructions, thereby constructing the functional units. The ECU 14 may be referred to as an EVECU.

<Battery Pack>

Figure 2:
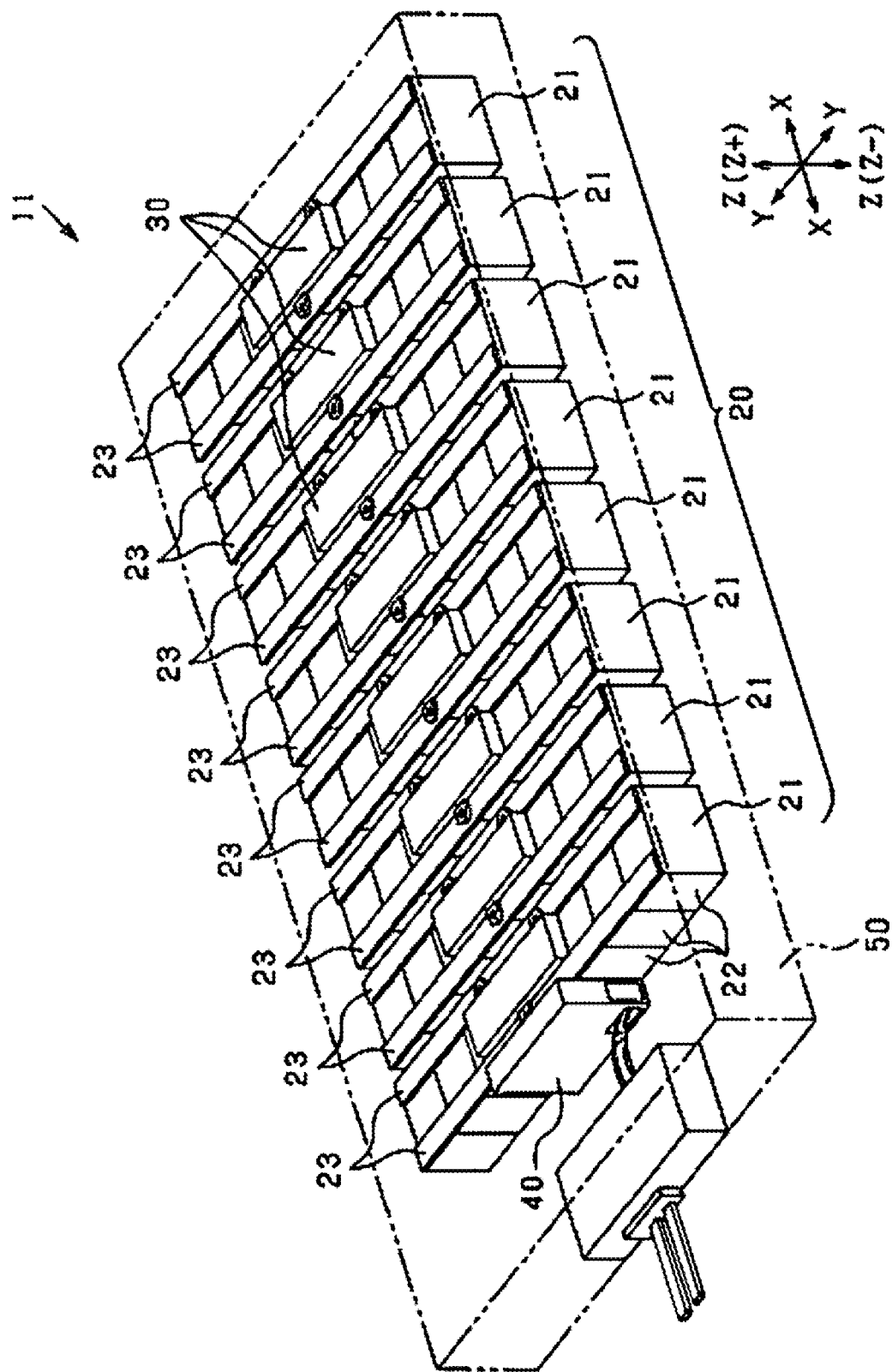
FIG. 2 is a perspective view illustrating a schematic configuration of the battery pack.
Figure 3:
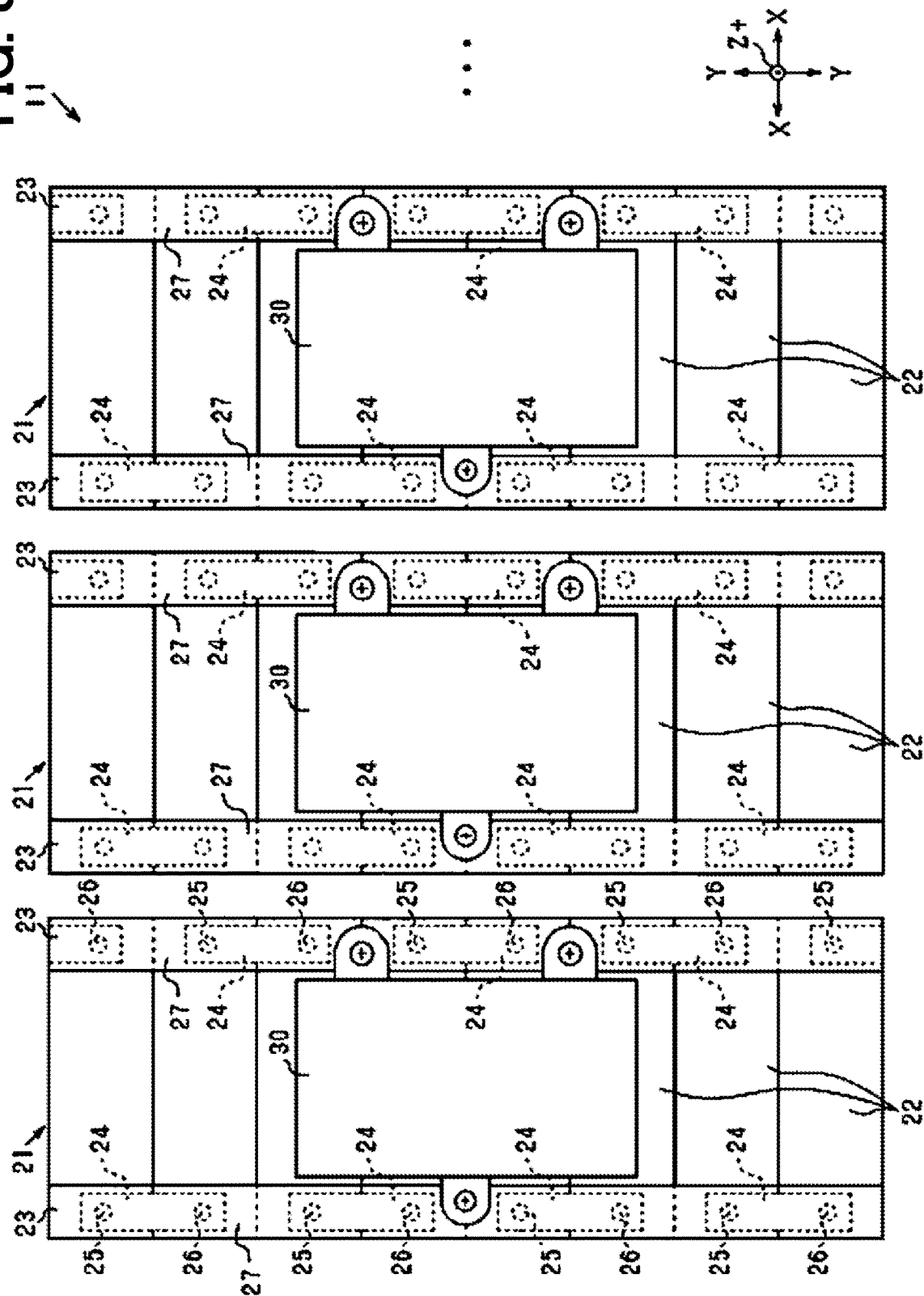
FIG. 3 is a top view illustrating an assembled battery.

Next, an example of a configuration of the battery pack 11 will be described with reference to FIGS. 2 and 3. FIG. 2 is a perspective view schematically illustrating an inside of the battery pack 11. In FIG. 2, a housing 50 is indicated by a two-dot chain line. FIG. 3 is a top view illustrating an upper surface of each battery stack.

As illustrated in FIG. 2, the battery pack 11 includes the assembled battery 20, monitoring devices 30, a controller 40, and the housing 50. Hereinafter, as illustrated in FIG. 2, a longitudinal direction is referred to as an X direction, and a lateral direction is referred to as a Y direction, on a mounting surface of the housing 50 attached to the vehicle 10 that is one of surfaces of the housing 50 having a substantially rectangular parallelepiped shape. In FIG. 2, a lower surface of the housing 50 is the mounting surface. An up-down direction perpendicular to the mounting surface is referred to as a Z direction. The X direction, the Y direction, and the Z direction are arranged to be orthogonal to each other. In the present embodiment, a right-left direction of the vehicle 10 corresponds to the X direction, a front-rear direction of the vehicle 10 corresponds to the Y direction, and the up-down direction of the vehicle 10 corresponds to the Z direction. The arrangement of FIGS. 2 and 3 is merely an example, and the battery pack 11 may be arranged in any manner relative to the vehicle 10.

The assembled battery 20 includes battery stacks 21 arranged side by side in the X direction. The battery stacks 21 may be referred to as battery blocks, battery modules, or the like. The assembled battery 20 is formed by the battery stacks 21 connected in series and/or in parallel. In the present embodiment, the battery stacks 21 are connected in series.

Each battery stack 21 has battery cells 22. The battery cells 22 are accommodated in a case. As a result, the relative positions of the battery cells 22 are fixed. The case is made of metal or resin. When the case is made of metal, an electrically insulating member may be partially or entirely interposed between a wall surface of the case and the battery cells 22.

The form of the fixing member is not particularly limited as long as the relative positions of the battery cells 22 can be fixed. For example, a configuration in which the battery cells 22 are restrained by a band having a strip shape can be adopted. In this case, a separator for keeping a separation distance between the battery cells 22 may be interposed between the battery cells 22.

Each battery stack 21 includes the battery cells 22 connected in series. In the battery stack 21 of the present embodiment, the battery cells 22 arranged side by side in the Y direction are connected in series. The assembled battery 20 provides the above-described DC voltage source. The assembled battery 20, the battery stacks 21, and the battery cells 22 correspond to a battery.

Each battery cell 22 is a secondary battery that generates an electromotive voltage by a chemical reaction. A lithium ion secondary battery, a nickel-metal hydride secondary battery, an organic radical battery, or the like can be adopted as the secondary battery. The lithium ion secondary battery is a secondary battery using lithium as a charge carrier. The secondary battery that can be adopted as the battery cell 22 may be not only a secondary battery in which the electrolyte is a liquid but also a so-called all-solid-state battery using a solid electrolyte.

The battery cell 22 includes a power generating element and a battery case that accommodates the power generating element. As illustrated in FIG. 3, the battery case of each battery cell 22 is formed in a flat shape. The battery case has two end surfaces facing in the Z direction, and having a total of four lateral surfaces including two lateral surfaces facing in the X direction and two lateral surfaces facing in the Y direction. The battery case of the present embodiment is made of metal.

The battery cells 22 are stacked such that lateral surfaces of the battery cases are in contact with each other in the Y direction. Each battery cell 22 has a positive electrode terminal 25 and a negative electrode terminal 26 at different ends in the X direction. The positive electrode terminal 25 and the negative electrode terminal 26 protrude in the Z direction, more specifically, a Z+ direction that is an upward direction. The positions of the end surfaces from which the positive electrode terminal 25 and the negative electrode terminal 26 protrude are the same in the Z direction for each battery cell 22. The battery cells 22 are stacked such that the positive electrode terminals 25 and the negative electrode terminals 26 are alternately arranged in the Y direction.

Linear bus bar units 23 are disposed at both ends of an upper surface of each battery stack 21 in the X direction. The bus bar units 23 are disposed on both ends, in the X direction, of the end surfaces of the battery cases from which the positive electrode terminal 25 and the negative electrode terminal 26 protrude. That is, a pair of bus bar units 23 are disposed in each battery stack 21.

Each bus bar unit 23 includes bus bars 24 electrically connecting the positive electrode terminals 25 and the negative electrode terminals 26 alternately arranged in the Y direction, and a bus bar cover 27 covering the bus bars 24. Each bus bar 24 is a plate material made of a metal having good conductivity such as copper or aluminum. The bus bar 24 electrically connects the positive electrode terminal 25 and the negative electrode terminal 26 of the battery cells 22 adjacent to each other in the Y direction. As a result, in each battery stack 21, the battery cells 22 are connected in series.

According to such a connection structure, in each battery stack 21, one of two battery cells 22 located at the opposite ends of the battery cells 22 arranged in the Y direction has the highest potential, and the other has the lowest potential. A predetermined wire is connected to at least one of the positive electrode terminal 25 of the battery cell 22 having the highest potential and the negative electrode terminal 26 of the battery cell 22 having the lowest potential.

As illustrated in FIG. 2, the battery stacks 21 are arranged in the X direction. The positive electrode terminal 25 of the battery cell 22 having the highest potential in one of two battery stacks 21 adjacent to each other in the X direction is connected via a predetermined wire to the negative electrode terminal 26 of the battery cell 22 having the lowest potential in the other of the two battery stacks 21. Accordingly, the battery stacks 21 are connected in series.

According to such a connection structure, one of two battery stacks 21 located at the opposite ends of the battery stacks 21 arranged in the X direction becomes a highest potential battery stack 21, and the other becomes a lowest potential battery stack 21. An output terminal is connected to the positive electrode terminal 25 of the battery cell 22 having the highest potential among the battery cells 22 in the highest potential battery stack 21. An output terminal is connected to the negative electrode terminal 26 of the battery cell 22 having the lowest potential among the battery cells 22 in the lowest potential battery stack 21. These two output terminals are connected to an electric device mounted on the vehicle 10 such as the PCU 12.

Two battery stacks 21 adjacent to each other in the X direction may not be electrically connected via a predetermined wire. Any two of the battery stacks 21 arranged in the X direction may be electrically connected via a predetermined wire. The positive electrode terminal 25 and the negative electrode terminal 26 electrically connected via a predetermined wire may be same or different in position in the Y direction. That is, the positive electrode terminal 25 and the negative electrode terminal 26 may at least partially face each other or not face each other at all in the X direction. One of the positive electrode terminal 25 and the negative electrode terminal 26 may be at least partially located or be not located at all in a projected area obtained by projecting the other of the positive electrode terminal 25 and the negative electrode terminal 26 in the X direction.

Each bus bar cover 27 is formed of an electrically insulating material such as resin. The bus bar cover 27 is provided linearly from one end to the other end of the battery stack 21 along the Y direction such that the bus bar cover 27 cover the multiple bus bars 24. The bus bar cover 27 may have a partition wall. The partition wall enhances insulation between two bus bars 24 adjacent to each other in the Y direction.

The monitoring devices 30 are individually provided for the battery stacks 21. As shown in FIG. 2, a monitoring device 30 is arranged between the pair of bus bar units 23 on each of the battery stacks 21. The monitoring device 30 faces the end surface of the battery case in the Z direction, the positive electrode terminal 25 and the negative electrode terminal 26 protruding from the end surface. The monitoring device 30 and the end surface may be separated from each other in the Z direction or may face each other and be in contact with each other in the Z direction. An object such as an insulating sheet may be interposed between the monitoring device 30 and the end surface.

The monitoring device 30 is fixed to the bus bar units 23 with a screw or the like. As will be described later, the monitoring device 30 is capable of performing wireless communication with the controller 40. An antenna 37, which will be described later, included in the monitoring device 30 is disposed so as not to overlap with the bus bar units 23 in the Z direction, that is, so as to protrude more than the bus bar units 23 in the Z direction.

A material of a coupling member such as a screw for coupling the monitoring device 30 and the bus bar units 23 may be, for example, a nonmagnetic material in order to avoid interference with wireless communication. In addition to the screw, among parts provided in the battery stack 21, a part that does not particularly need to have magnetism can adopt a nonmagnetic material as its constituent material.

In the present embodiment, the monitoring devices 30 are arranged in the X direction. The monitoring devices 30 are the same in position in the Y direction. With the configuration described above, extension of the separation intervals of the monitoring devices 30 are reduced.

The controller 40 is attached to an outer side surface of a battery stack 21 disposed at one end in the X direction. The controller 40 is capable of performing wireless communication with each monitoring device 30. An antenna 42, which will be described later, included in the controller 40 is disposed at about the same height as the antenna 37 of the monitoring device 30 in the Z direction. That is, the antenna 42 of the controller 40 is provided so as to protrude more than the bus bar units 23 in the Z direction.

In the battery pack 11, the monitoring devices 30 and the controller 40 provide a battery management system 60 described later. That is, the battery pack 11 includes the battery management system 60.

In order to avoid the battery pack 11 from becoming an electromagnetic noise source, it may be necessary to reduce leakage of radio waves of wireless communication to the outside of a communication space where wireless communication between the monitoring device 30 and the controller 40 is performed. Conversely, in order to reduce interference of the wireless communication, it may be necessary to reduce entry of electromagnetic noise into the communication space.

For this reason, the housing 50 is capable of reflecting electromagnetic waves, for example. The housing 50 includes a material in order to reflect electromagnetic waves, described below as an example. For example, the housing 50 includes a magnetic material such as metal. The housing 50 includes a resin material and a magnetic material covering a surface of the resin material. The housing 50 includes a resin material and a magnetic material embedded in the resin material. The housing 50 includes carbon fibers. The housing 50 may be capable of absorbing electromagnetic waves instead of reflecting electromagnetic waves.

The housing 50 may have a hole communicating with an accommodation space inside the housing 50 and a space (external space) outside the housing 50. The hole is defined by a coupling surface that is between and connecting an inner surface and an outer surface of the housing 50. The hole is used for ventilation, extraction of a power line, and extraction of a signal line, for example. In the case of a configuration having a hole, a cover may be provided on the hole. The cover prevents communication between the accommodation space and the external space. The cover may block an entire or a part of the hole.

The cover is provided, for example, on either one of the inner surface, the outer surface, or the coupling surface of the housing 50. The cover may be disposed to face the hole so as to cover the hole, instead of being provided on either one of the inner surface, the outer surface, or the coupling surface. In a case where the cover and the hole are separated from each other, a separation gap therebetween is shorter than a length of the hole. The length of the hole is either a dimension between the inner surface and the outer surface, or a dimension in a direction orthogonal to the distance between the inner surface and the outer surface.

The cover is, for example, a connector, an electromagnetic shielding member, a sealing material, or the like. The cover includes a material described below as an example. The cover includes, for example, a magnetic material such as metal. The cover includes a resin material and a magnetic material covering a surface of the resin material. The cover includes a resin material and a magnetic material embedded in the resin material. The cover includes carbon fibers. The cover includes a resin material.

The hole of the housing 50 may be covered with at least one of elements accommodated in the accommodation space of the housing 50. A separation gap between the accommodated element and the hole is shorter than the length of the hole described above. The power line and the signal line may be disposed across the accommodation space and the external space while being held by an electrically insulating member forming a part of a wall of the housing 50.

<Battery Management System>

Figure 4:
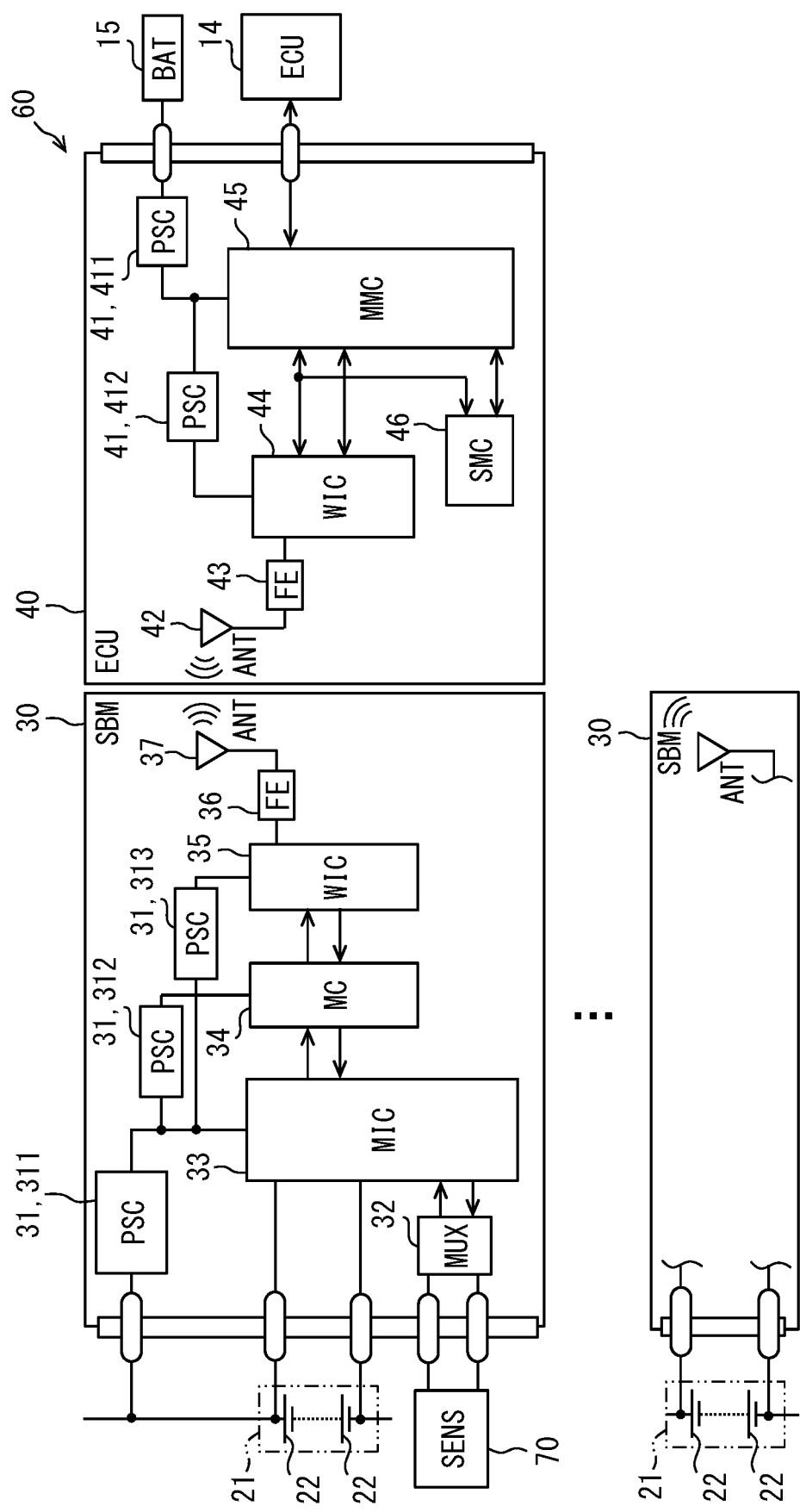
FIG. 4 is a block diagram illustrating a configuration of a battery management system.

Next, a schematic configuration of the battery management system will be described with reference to FIG. 4. FIG. 4 is a block diagram showing the configuration of the battery management system.

As shown in FIG. 4, the battery management system 60 includes the monitoring devices (SBMs) 30 and the controller (ECU) 40. In the following, a monitoring device may be referred to as SBM. The controller 40 may be referred to as a battery ECU or a BMU. BMU is an abbreviation for Battery Management Unit. The battery management system 60 is a system that manages batteries using wireless communication. This wireless communication uses a frequency band used in short-range communication, for example, a 2.4 GHz band or a 5 GHz band.

The battery management system 60 adopts one-to-one communication or network communication depending on the number of nodes of wireless communication performed by the monitoring devices 30 and/or the controller 40. The number of nodes may vary depending on resting states of the monitoring devices 30 and/or the controller 40. When the number of nodes is two, the battery management system 60 adopts one-to-one communication. When the number of nodes is 3 or more, the battery management system 60 adopts network communication. One example of network communication is star communication in which wireless communication is performed between one node as a master and the other nodes as slaves. Another example of network communication is chain communication in which multiple nodes are connected in series to perform wireless communication.

The battery management system 60 further includes a sensor 70. The sensor 70 includes a physical quantity detection sensor that detects a physical quantity of each battery cell 22, and a determination sensor. The physical quantity detection sensor includes a voltage sensor, a temperature sensor, and a current sensor, for example.

The voltage sensor includes a detection line coupled to a bus bar 24. The voltage sensor detects a voltage (cell voltage) of each of the battery cells 22. The determination sensor determines whether a correct battery is attached.

The temperature sensor is selectively provided in some of battery cells 22 included in a battery stack 21. The temperature sensor detects a temperature (cell temperature) of selected one of the battery cells 22 as a temperature of the battery stack 21. Among the battery cells 22 included in one battery stack 21, a battery cell 22 expected to have the highest temperature, a battery cell 22 expected to have the lowest temperature, a battery cell 22 expected to have an intermediate temperature are provided with the temperature sensor, for example. The number of temperature sensors for one battery stack 21 is not particularly limited.

The current sensor is provided in the battery stacks 21. The current sensor detects a current (cell current) commonly flowing through the battery cells 22 connected in series and the battery stacks 21 connected in series. In the present embodiment, one current sensor is provided because all the battery stacks 21 are connected in series. However, the number of current sensors is not limited to this example.

<Monitoring Device>

First, the monitoring devices 30 will be described. Each monitoring device 30 has a common configuration. The monitoring device 30 includes a power supply circuit (PSC) 31, a multiplexer (MUX) 32, a monitoring IC (MIC) 33, a microcontroller (MC) 34, a wireless IC (WIC) 35, a front end circuit (FE) 36, and the antenna (ANT) 37. Communication between elements within the monitoring device 30 is performed via wires.

The power supply circuit 31 uses a voltage supplied from the battery stacks 21 to generate operation power of other circuit elements included in the monitoring device 30. In the present embodiment, the power supply circuit 31 includes power supply circuits 311, 312, and 313. The power supply circuit 311 generates a predetermined voltage using the voltage supplied from the battery stacks 21 and supplies the generated voltage to the monitoring IC 33. The power supply circuit 312 generates a predetermined voltage using the voltage generated by the power supply circuit 311 and supplies the generated voltage to the microcontroller 34. The power supply circuit 313 generates a predetermined voltage using the voltage generated by the power supply circuit 311 and supplies the generated voltage to the wireless IC 35.

The multiplexer 32 is a selection circuit that selects one of detection signals of at least some of the sensors 70 included in the battery pack 11 and outputs the selected signal. The multiplexer 32 selects (switches) an input according to the selected signal from the monitoring IC 33 and outputs the input as one signal.

The monitoring IC 33 senses (acquires) battery information such as a cell voltage and a cell temperature, and transmits the battery information to the microcontroller 34. For example, the monitoring IC 33 acquires the cell voltage directly from the voltage sensor, and acquires information such as the cell temperature through the multiplexer. The monitoring IC 33 acquires the cell voltage and determines which battery cell 22 corresponds to the cell voltage. That is, the monitoring IC 33 acquires the cell voltage while performing cell determination. The cell current detected by the current sensor may be input to the monitoring IC 33 or may be input to the controller 40 by wired transmission.

The monitoring IC 33 may be referred to as a cell monitoring circuit (CSC). CSC is an abbreviation for Cell Supervising Circuit. The monitoring IC 33 executes malfunction diagnosis of a circuit portion of the monitoring device 30 including the monitoring IC 33 itself. That is, the monitoring IC 33 transmits battery monitoring information including battery information and malfunction diagnosis information to the microcontroller 34. The monitoring device 30 may store (retain) the acquired battery monitoring information in a memory such as the microcontroller 34. Upon receiving data requesting acquisition of the battery monitoring information transmitted from the microcontroller 34, the monitoring IC 33 senses the battery information and transmits the battery monitoring information including the battery information to the microcontroller 34. In addition to the above example, the battery monitoring information may include, for example, information such as a flue gas temperature, an impedance, a state of balancing of cell voltages, a stack voltage, a state of synchronization with the controller 40, or presence or absence of abnormality of detection wiring.

The microcontroller 34 is a microcomputer and includes a CPU as a processor, a ROM and a RAM as memories, an input/output interface, a bus that connects these components. The CPU constructs multiple functional units by executing various programs stored in the ROM while using a temporary storage function of the RAM. ROM is abbreviation for Read Only Memory. The RAM is abbreviation for Random Access Memory.

The microcontroller 34 controls a schedule of sensing and self-diagnosis performed by the monitoring IC 33. The microcontroller 34 receives the battery monitoring information transmitted from the monitoring IC 33 and transmits the battery monitoring information to the wireless IC 35. The microcontroller 34 transmits data requesting acquisition of the battery monitoring information to the monitoring IC 33. For example, upon receiving the data requesting acquisition of the battery monitoring information transmitted from the wireless IC 35, the microcontroller 34 may transmit the data requesting acquisition of the battery monitoring information to the monitoring IC 33. The microcontroller 34 may autonomously request the monitoring IC 33 to acquire the battery monitoring information. For example, the microcontroller 34 may cyclically request the monitoring IC 33 to acquire the battery monitoring information.

The wireless IC 35 includes an RF circuit and a microcontroller (not illustrated) in order to wirelessly transmit and receive data. The microcontroller of the wireless IC 35 includes a memory. The wireless IC 35 has a transmission function of modulating transmission data and oscillating at a frequency of an RF signal. The wireless IC 35 has a reception function of demodulating received data. RF is an abbreviation for Radio Frequency.

The wireless IC 35 modulates the data including the battery monitoring information transmitted from the microcontroller 34, and transmits the modulated data to another node such as the controller 40 via the front end circuit 36 and the antenna 37. The wireless IC 35 adds data necessary for wireless communication such as communication control information to the transmission data including the battery monitoring information, and then transmits the data. The data necessary for wireless communication includes, for example, an identifier (ID) and an error detection code. The wireless IC 35 controls a data size, a communication format, a schedule, and error detection in wireless communication with another node, for example.

The wireless IC 35 receives data transmitted from another node via the antenna 37 and the front end circuit 36, and then demodulates the data. For example, upon receiving data including a transmission request for battery monitoring information, the wireless IC 35 transmits data including the battery monitoring information to the other node in response to the request. In addition to the battery monitoring information described above, the monitoring device 30 may transmit battery traceability information and/or manufacturing history information to the other node. The battery traceability information is, for example, the number of charge/discharge times, the number of malfunctions, and a total charge/discharge time. The manufacturing history information is, for example, a manufacturing date, a place, a manufacturer, a serial number, and a manufacturing number. The manufacturing history information is stored in a memory included in the monitoring device 30. The monitoring device 30 may transmit the battery traceability information and/or the manufacturing history information instead of the battery monitoring information described above to the other node.

The front end circuit 36 includes a matching circuit for impedance matching between the wireless IC 35 and the antenna 37, and a filter circuit for removing unnecessary frequency components.

The antenna 37 converts an electric signal into radio waves and emits the radio waves into a space. The antenna 37 receives radio waves propagating in the space and converts the radio waves into an electric signal.

<Controller>

Next, the controller 40 will be described with reference to FIG. 4. The controller 40 includes a power supply circuit (PSC) 41, the antenna (ANT) 42, a front end circuit (FE) 43, a wireless IC (WIC) 44, a main microcontroller (MMC) 45, and a sub microcontroller (SMC) 46. Communication between elements inside the controller 40 is performed by wire.

The power supply circuit 41 uses a voltage supplied from a battery (BAT) 15 to generate an operating power source for other circuit elements included in the controller 40. The battery 15 is a DC voltage source mounted on the vehicle 10 and different from the battery pack 11. The battery 15 supplies electric power to an auxiliary machine of the vehicle 10, and therefore may be referred to as an auxiliary battery. In the present embodiment, the power supply circuit 41 includes power supply circuits 411 and 412. The power supply circuit 411 generates a predetermined voltage using the voltage supplied from the battery 15 and supplies the generated voltage to the main microcontroller 45 and the sub microcontroller 46. For simplification of the drawings, electrical connection between the power supply circuit 411 and the sub microcontroller 46 is omitted. The power supply circuit 412 generates a predetermined voltage using the voltage generated by the power supply circuit 411 and supplies the predetermined voltage to the wireless IC 44.

The antenna 42 converts an electric signal into radio waves and emits the radio waves into a space. The antenna 42 receives radio waves propagating in the space and converts the radio waves into an electric signal.

The front end circuit 43 includes a matching circuit for impedance matching between the wireless IC 44 and the antenna 42, and a filter circuit for removing unnecessary frequency components.

The wireless IC 44 includes an RF circuit and a microcontroller (not illustrated) in order to wirelessly transmit and receive data. The wireless IC 44 has a transmission function and a reception function like the wireless IC 35. The wireless IC 44 receives data transmitted from the monitoring device 30 via the antenna 42 and the front end circuit 43, and then demodulates the data. The wireless IC 44 transmits data including battery monitoring information to the main microcontroller 45. The wireless IC 44 receives and modulates data transmitted from the main microcontroller 45, and transmits the data to the monitoring device 30 via the front end circuit 43 and the antenna 42. The wireless IC 44 adds data necessary for wireless communication such as communication control information to the transmission data and transmits the data. The data necessary for wireless communication includes, for example, an identifier (ID) and an error detection code. The wireless IC 44 controls a data size, a communication format, a schedule, and error detection in wireless communication with other nodes.

The main microcontroller 45 is a microcomputer including a CPU, a ROM, a RAM, an input/output interface, and a bus that connects these components. The ROM stores various programs to be executed by the CPU. The main microcontroller 45 generates a command requesting the monitoring device 30 to perform predetermined process, and transmits transmission data including the command to the wireless IC 44. The main microcontroller 45 generates, for example, a command for requesting transmission of battery monitoring information. The main microcontroller 45 may generate a command for requesting not only acquisition of battery monitoring information but also transmission of the battery monitoring information. A request described herein may be referred to as an instruction.

The main microcontroller 45 receives data including battery monitoring information transmitted from the wireless IC 44, and performs predetermined process on the basis of the battery monitoring information. In the present embodiment, the main microcontroller 45 acquires a cell current from the current sensor, and performs predetermined process on the basis of the battery monitoring information and the acquired cell current. For example, the main microcontroller 45 performs a process of transmitting the acquired battery monitoring information to the ECU 14. The main microcontroller 45 may calculate at least one of the internal resistance, the open circuit voltage (OCV), the SOC, and the SOH of the battery cell 22 on the basis of the battery monitoring information, and transmit information including the calculated data to the ECU 14. OCV is an abbreviation for Open Circuit Voltage.

The main microcontroller 45 performs estimation process to estimate the internal resistance and the open circuit voltage of the battery cell 22 on the basis of, for example, the cell voltage and the cell current. The open circuit voltage is a cell voltage corresponding to the SOC of the battery cell 22. The open circuit voltage is a cell voltage when no current flows. The open circuit voltage and the cell voltage acquired by the monitoring device 30 have a difference by a voltage drop according to the internal resistance and the cell current. The internal resistance changes according to the cell temperature. The lower the cell temperature, the larger the value of the internal resistance. The main microcontroller 45 performs estimation process to estimate the internal resistance and the open circuit voltage of the battery cell 22 in also consideration of, for example, the cell temperature.

The main microcontroller 45 may instruct execution of balancing process for equalizing the voltages of the battery cells 22 on the basis of the battery monitoring information. The main microcontroller 45 may acquire an IG signal of the vehicle 10 and perform the above-described processes according to the driving state of the vehicle 10. The main microcontroller 45 may perform process of detecting an abnormality of the battery cell 22 or the circuit on the basis of the battery monitoring information, and may transmit abnormality detection information to the ECU 14.

The sub microcontroller 46 is a microcomputer including a CPU, a ROM, a RAM, an input/output interface, and a bus that connects these components. The ROM stores various programs to be executed by the CPU. The sub microcontroller 46 performs a monitoring process inside the controller 40. For example, the sub microcontroller 46 may monitor data between the wireless IC 44 and the main microcontroller 45. The sub microcontroller 46 may monitor a state of the main microcontroller 45. The sub microcontroller 46 may monitor a state of the wireless IC 44.

<Communication in Operating State>

The battery management system 60 according to the present embodiment performs star network communication in an operating state of the assembled battery 20 in which power is supplied from the assembled battery 20 to an in-vehicle system such as the MG 13 via a system main relay (SMR) (not illustrated). That is, the controller 40 performs wireless communication with each of the monitoring devices 30 via individually established communication connections. Wireless communication between one monitoring device 30 and the controller 40 will be described hereinbelow for convenience. The controller 40 performs similar processes with all the monitoring devices 30.

Figure 5:
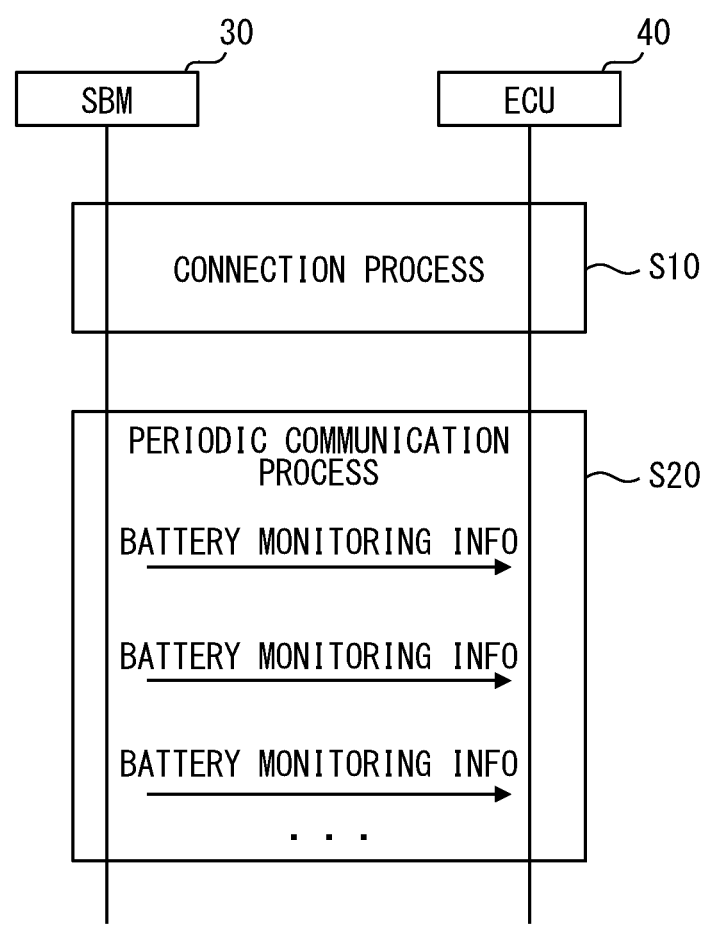
FIG. 5 is a diagram illustrating a communication sequence between a monitoring device and a controller.
Figure 6:
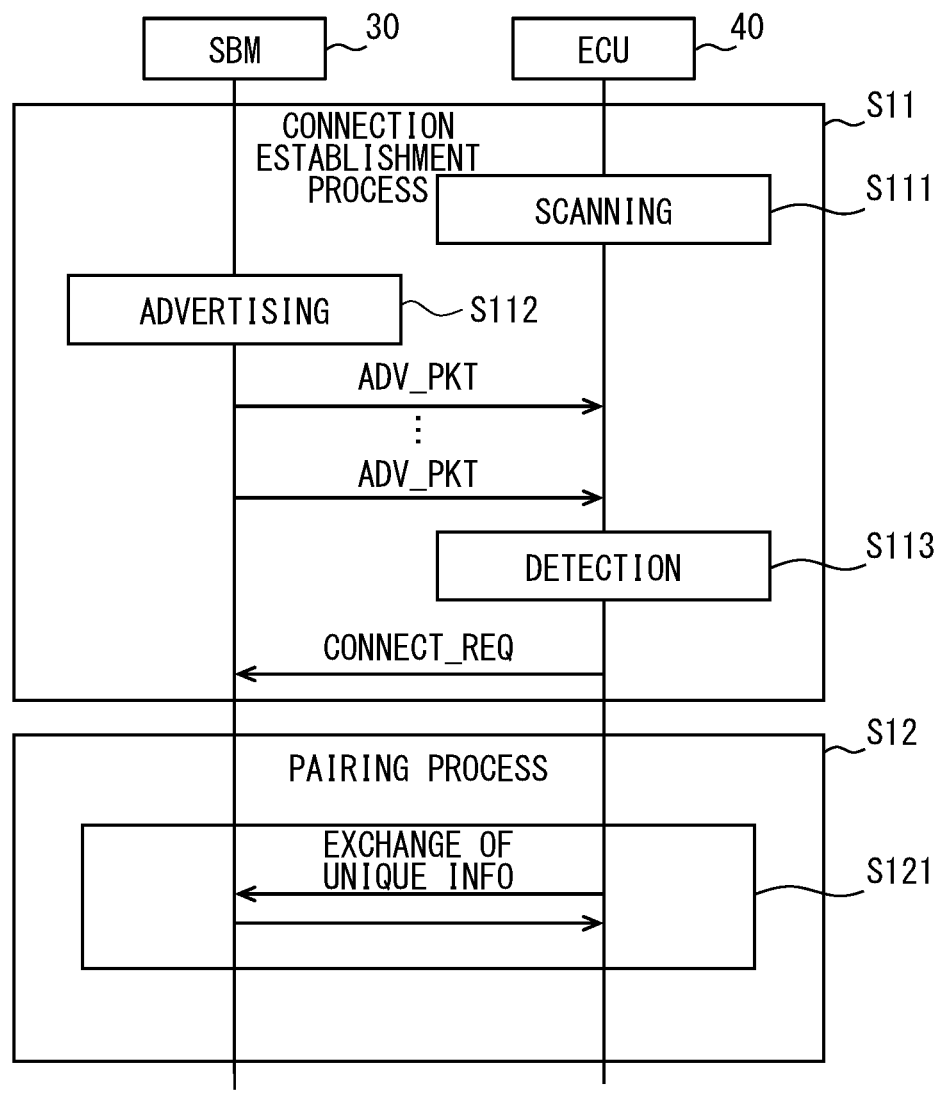
FIG. 6 is a diagram illustrating a connection process.

First, referring to FIGS. 5 and 6, a connection process for establishing an individual communication connection between each monitoring device 30 and the controller 40 will be described. FIG. 5 is a diagram illustrating a communication sequence between the monitoring device 30 and the controller 40. The communication sequence may be referred to as a communication flow. FIG. 6 illustrates an example of the connection process. In FIGS. 5 and 6, the controller 40 is represented as an ECU 40.

As illustrated in FIG. 5, the connection process (S10) is performed between the controller 40 and each monitoring device 30 in order to individually establish a communication connection with each of the monitoring devices 30. In the communication connection, the controller 40 acts as a communication master and each monitoring device 30 acts as a communication slave. Since the controller 40 and each monitoring device 30 perform communication according to a BLE communication protocol, the connection process (S10) includes a connection establishment process (S11) and a pairing process (S12) as illustrated in FIG. 6. BLE is an abbreviation for Bluetooth Low Energy. Bluetooth is a registered trademark. However, communication between the controller 40 and each monitoring device 30 may be performed according to a communication protocol other than the BLE communication protocol.

In the connection establishment process (S11), the controller 40 performs a scanning operation (S111), and the monitoring device 30 performs an advertising operation (S112). A start of the scanning operation may be earlier than, approximately the same timing as, or later than a start of the advertising operation.

In order to notify the controller 40 of presence of the monitoring device 30, the wireless IC 35 of the monitoring device 30 performs the advertising operation to transmit an advertisement packet (ADV_PKT) to the wireless IC 44 of the controller 40. The advertisement packet includes ID information of the monitoring device 30 and ID information of the controller 40.

Upon detecting the advertisement packet by the scanning operation, that is, detecting the monitoring device 30, the controller 40 transmits a connection request (CONNECT_REQ) to the detected monitoring device 30 (S113).

When the monitoring device 30 receives the connection request, a connection is established between the one monitoring device 30 and the controller 40. When the connection is established, the monitoring device 30 stops transmitting the advertisement packet. The monitoring device 30 cyclically transmits the advertisement packet until a connection is established.

When the connection establishment process ends, a pairing process (S12) is subsequently performed. The pairing process is a process for performing encrypted data communication. The pairing process includes a unique information exchange process (S121). In the exchange process, unique information (e.g., encryption key or information for generating encryption key) held by both devices are exchanged and stored in each memory. After the process of step S121 is performed, encryption using the exchanged unique information becomes possible.

While an example in which the controller 40 performs the scanning operation and the monitoring device 30 performs the advertising operation has been described, the present invention is not limited to this example. The monitoring device 30 may perform the scanning operation, and the controller 40 may perform the advertising operation.

Figure 7:
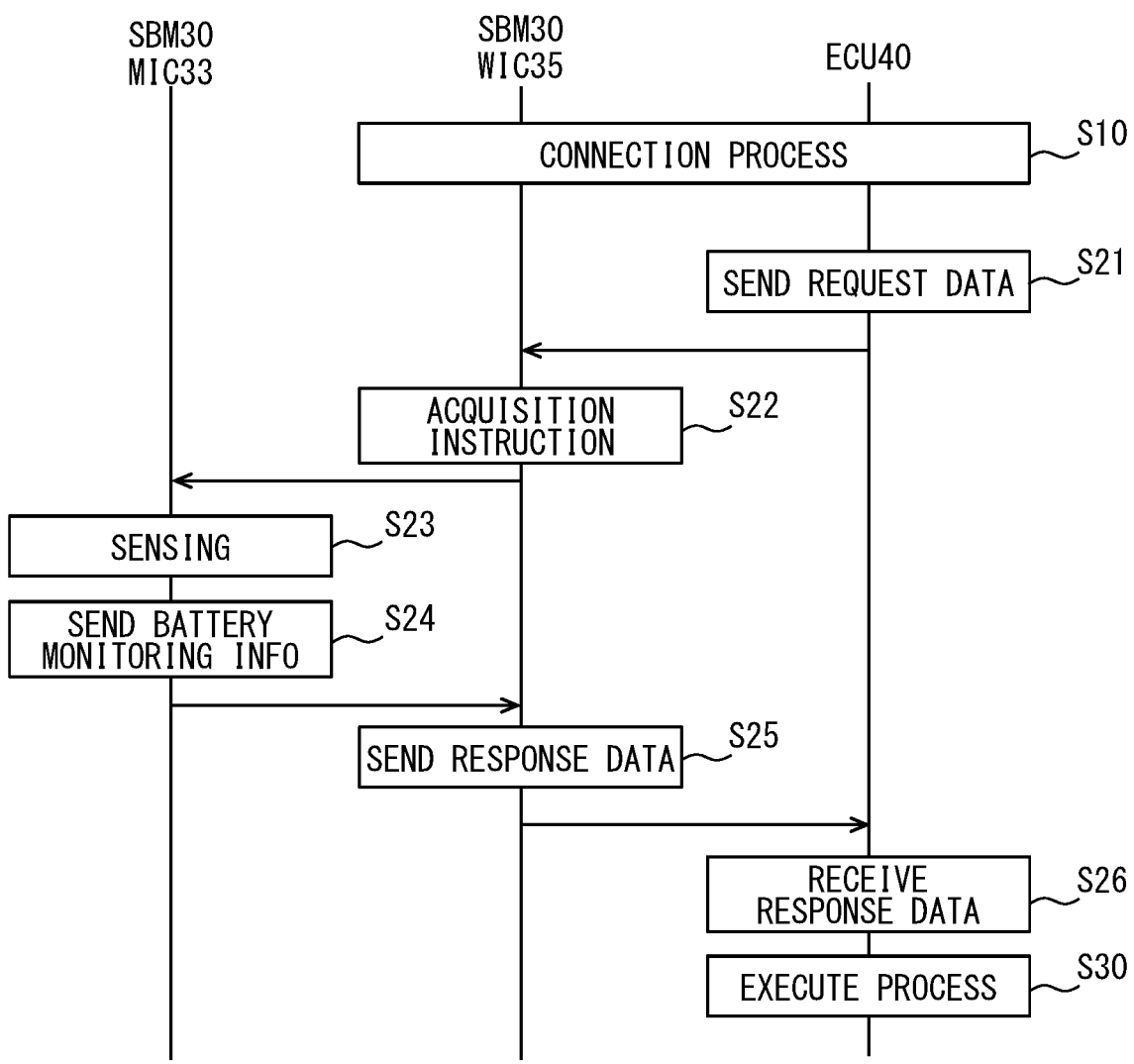
FIG. 7 is a diagram illustrating a periodic communication process.

Next, referring to FIGS. 5 and 7, periodic communication process performed between the monitoring device 30 and the controller 40 in the operating state of the assembled battery 20 will be described. FIG. 7 illustrates an example of periodic communication process. In FIG. 7, the monitoring IC 33 is shown as a MIC 33, the wireless IC 35 is shown as a WIC 35, and the controller 40 is shown as an ECU 40.

When the connection process described above is completed, the monitoring device 30 and the controller 40 perform a periodic communication process (S20). In the periodic communication process, the controller 40 and the monitoring device 30 periodically (cyclically) perform data communication. In the data communication, for example, as illustrated in FIG. 7, the controller 40 transmits request data (S21) to the monitoring device 30 that has completed the connection process with the controller 40. As an example, the controller 40 transmits request data including an acquisition request and a transmission request of battery monitoring information.

Upon receiving the request data, the wireless IC 35 of the monitoring device 30 transmits a request for acquisition of the battery monitoring information, that is, an acquisition instruction to the monitoring IC 33 (S22). The wireless IC 35 of the present embodiment transmits the acquisition request to the monitoring IC 33 via the microcontroller 34.

Upon receiving the acquisition request, the monitoring IC 33 performs sensing (S23). The monitoring IC 33 performs sensing and acquires battery information of each battery cell 22. The monitoring IC 33 also executes circuit malfunction diagnosis.

Next, the monitoring IC 33 transmits the acquired battery monitoring information to the wireless IC 35 (S24). In the present embodiment, the monitoring IC 33 transmits battery monitoring information including a malfunction diagnosis result as well as battery information. The monitoring IC 33 transmits the battery monitoring information to the wireless IC 35 via the microcontroller 34.

When the wireless IC 35 receives the battery monitoring information from the monitoring IC 33, the wireless IC 35 transmits transmission data including the battery monitoring information, that is, response data to the controller 40 (S25). The controller 40 receives the response data (S26). The controller 40 periodically performs the data communication with the monitoring device 30 to which the connection is established.

On the basis of the received response data, that is, the battery monitoring information, the controller 40 performs predetermined processes (S30). For example, the controller 40 performs the process of transmitting the acquired battery monitoring information to the ECU 14, the process of instructing execution of the balancing process of equalizing the voltages of the battery cells 22, and a process of detecting abnormality of the battery cell 22 as described above.

While an example in which the monitoring device 30 acquires battery monitoring information on the basis of an acquisition request from the controller 40 has been described, the present invention is not limited to this example. The monitoring device 30 may autonomously acquire battery monitoring information and transmit the battery monitoring information to the controller 40 on the basis of a transmission request from the controller 40. Accordingly, the processes of steps S22 to S24 in response to an acquisition request becomes unnecessary.

<Communication in Non-Operating State>

The battery management system 60 according to the present embodiment maintains communication between the controller 40 and the monitoring devices 30 even in a non-operating state of the assembled battery 20 in order to quickly start communication between the controller 40 and the monitoring devices 30 at the time of switching from the non-operating state to the operating state of the assembled battery 20. The non-operating state is, for example, a state in which the SMR is turned off by turning off of the ignition switch and power need not be supplied from the assembled battery 20 to the in-vehicle system such as the MG 13 via the SMR. FIG. 8(a) shows a communication mode (i.e., star network) during the operating state of the assembled battery 20 in which the controller 40 acts as a communication master and individually communicates with the monitoring devices 30 serving as communication slaves. If this communication mode is maintained even in the non-operating state of the assembled battery 20, power consumption by the controller 40 becomes larger than power consumption by each of the monitoring devices 30. The main reasons are that the controller 40 needs to communicate with the multiple monitoring devices 30, and that a function of the communication master to perform communication schedule management and the like generally is higher in load than a function of the communication slave. The assembled battery 20 supplies power to a device such as the monitoring device 30 directly connected to the assembled battery 20 without through SMR, even in the non-operating state of the assembled battery 20.

Therefore, the battery management system 60 according to the present embodiment switches a communication mode into a mode different from that in the operating state when the assembled battery 20 is in the non-operating state. Accordingly, communication between the controller 40 and the monitoring devices 30 can be maintained while power consumption of the controller 40 being reduced. Hereinafter, the communication mode between the controller 40 and the monitoring devices 30 in the non-operating state of the assembled battery 20 will be described in detail.

FIG. 8(b) is a diagram illustrating an example of a communication network in the non-operating state of the assembled battery 20. As illustrated in FIG. 8(b), in the non-operating state of the assembled battery 20, the controller 40 acts as a communication master for one monitoring device 30_1 among the monitoring devices 30_1, 30_2, 30_3. One of the monitoring devices 30_1, 30_2, 30_3 sequentially acts as a communication master for another of the monitoring devices 30_1, 30_2, 30_3. That is, in the non-operating state of the assembled battery 20, the controller 40 and the monitoring devices 30_1, 30_2, 30_3 establish a sequential connection, and the communication mode between the controller 40 and the monitoring devices 30_1, 30_2, 30_3 is a chain network. By adopting such communication mode in the non-operating state of the assembled battery 20, power consumption of the devices 40, 30_1, 30_2, 30_3 can be equalized.

Figure 8:
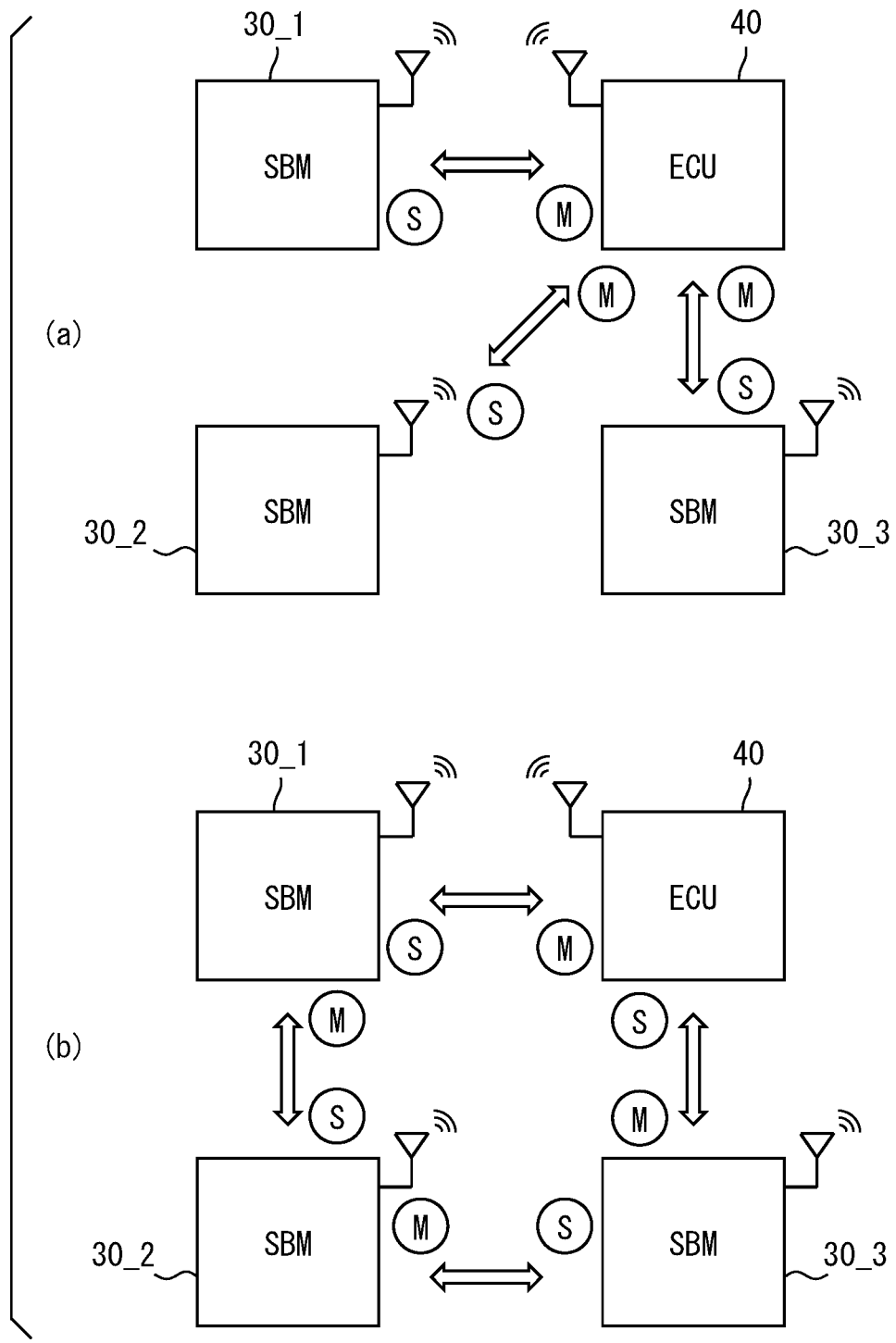
FIG. 8 is a diagram (a) illustrating a communication mode among the controller and monitoring devices in an operating state of the assembled battery, and a diagram (b) illustrating a communication mode among the controller and the monitoring devices in a non-operating state of the assembled battery, according to a first embodiment.

In the example illustrated in FIG. 8(*b*), the controller 40 acts as not only the communication master for the monitoring device 30_1 but also a communication slave for the monitoring device 30_3. However, one of communication paths between the controller 40 and the monitoring device 30_1 and between the monitoring devices 30_1, 30_2, 30_3 may be omitted. This is because the controller 40 and all the monitoring devices 30_1, 30_2, 30_3 can join the communication network even if one communication path is not formed. While the number of monitoring devices 30 is three in FIG. 8(*b*), the number of monitoring devices 30 is not limited to this number, and may be two, four, or more. In a case where the number of monitoring devices 30 is large, the number of communication networks illustrated in FIG. 8(*b*) may be more than one. In this case, the controller 40 may act as communication masters for two or more monitoring devices 30.

Next, with reference to a flowchart of FIG. 9, processes performed by the controller 40 and each of the monitoring devices 30_1, 30_2, 30_3 for changing the communication network when the assembled battery 20 is switched from the operating state to the non-operating state and from the non-operating state to the operating state will be described.

At step S40, the controller 40 detects turning-off of the ignition switch as a trigger for switching from the operating state to the non-operating state of the assembled battery 20. However, the switching from the operating state to the non-operating state of the assembled battery 20 may be detected by using, as a trigger, stoppage of the vehicle, a fact that a driver gets off the vehicle, or a fact that each door of the vehicle is locked, for example. Upon detecting that the ignition switch is turned off, the controller 40 notifies each of the monitoring devices 30_1, 30_2, 30_3 that the ignition switch is turned off. In other words, each of the monitoring devices 30_1, 30_2, 30_3 is notified that the mode of the communication network needs to be changed to the chain network for the non-operating state of the assembled battery 20.

Since the controller 40 and the monitoring devices 30_1, 30_2, 30_3 each act as not only a communication master but also a communication slave for other devices 40, 30_1, 30_2, 30_3, the controller 40 and the monitoring devices 30_1, 30_2, 30_3 each performs a connection accepting operation (scanning operation) and a connection requesting operation (advertising operation). More specifically, the controller 40 and of the monitoring devices 30_1, 30_2, 30_3 each performs the connection accepting operation and the connection requesting operation at different timings as illustrated in the flowchart of FIG. 9. Combinations of the devices 40, 30_1, 30_2, 30_3 serving as the communication masters and the devices 40, 30_1, 30_2, 30_3 serving as the communication slaves can be set in advance. However, the combinations may be determined by one of the controller 40 and the monitoring devices 30_1, 30_2, 30_3 upon detecting that the ignition switch is turned off, and then the one device may notify the other devices 40, 30_1, 30_2, 30_3 of the combinations.

Figure 9:
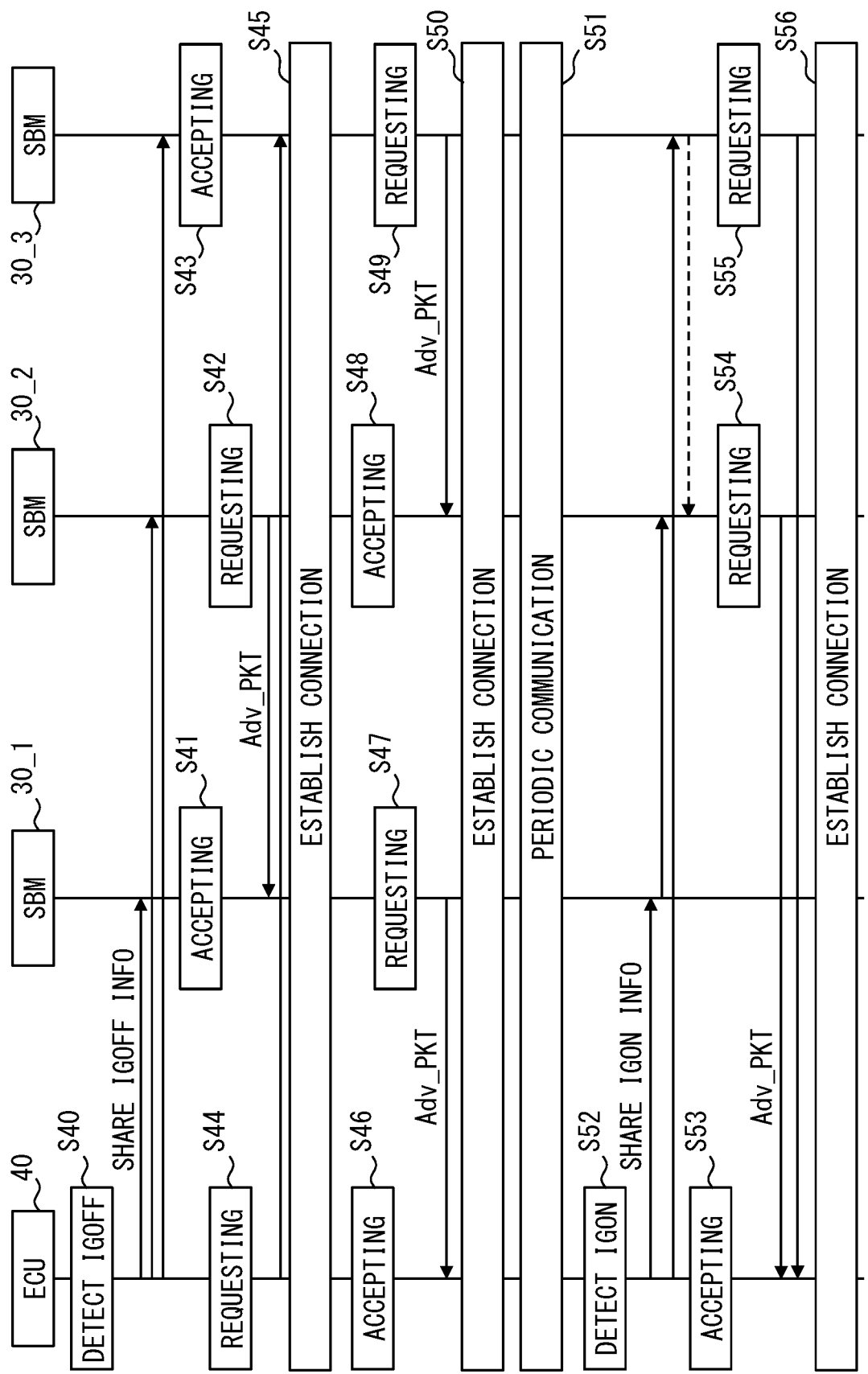
FIG. 9 is a flowchart illustrating processes in the controller and the monitoring devices according to the first embodiment.

For example, in the example illustrated in the flowchart of FIG. 9, the monitoring device 30_1 performs the connection accepting operation in step S41 to act as a communication master for the monitoring device 30_2, and the monitoring device 30_2 performs the connection requesting operation in step S42 to act as a communication slave for the monitoring device 30_1. The monitoring device 30_3 performs the connection accepting operation in step S43 to act as a communication master for the controller 40, and the controller 40 performs the connection requesting operation for step S44 to act as a communication slave for the monitoring device 30_3. In step S45, the connection establishment operation between the monitoring device 30_1 and the monitoring device 30_2, and between the monitoring device 30_3 and the controller 40 is performed. In the connection establishment operation, a communication master detects an advertisement packet sent from a communication slave, transmits a connection request (CONNECT_REQ) to the communication slave, and further, the communication master and the communication slave exchange unique information.

In the star network formed in the operating state of the assembled battery 20, a communication connection is already established between the controller 40 as a communication master and the monitoring device 30_3 a communication slave. This established communication connection may be utilized, and the roles of the communication master and the communication slave may be switched between the controller 40 and the monitoring device 30_3 instead of performing the connection accepting operation in step S43 and the connection requesting operation in step S44. This roles switching may be performed if such switching of the roles of the communication master and the communication slave using the established communication connection is easier and completed more promptly than the establishment of a new communication connection by the scanning operation and the advertising operation.

In the example illustrated in the flowchart of FIG. 9, after the completion of the connection establishment operation in step S45, the controller 40 performs the connection accepting operation in step S46 to act as a communication master for the monitoring device 30_1, and the monitoring device 30_1 performs the connection requesting operation in step S47 to act as a communication slave for the controller 40. The monitoring device 30_2 performs the connection accepting operation in step S48 to act as a communication master for the monitoring device 30_3, and the monitoring device 30_3 performs the connection requesting operation in step S49 to act as a communication slave for the monitoring device 30_2. In step S50, the connection establishment operations between the controller 40 and the monitoring device 30_1 and between the monitoring device 30_2 and the monitoring device 30_3 are performed.

In the star network formed in the operating state of the assembled battery 20, a communication connection is already established between the controller 40 as a communication master and the monitoring device 30_1 a communication slave. Since the established communication connection can be directly used as the communication connection between the controller 40 and the monitoring device 30_1, the connection accepting operation in step S46 and the connection requesting operation in step S47 may be omitted.

The flowchart of FIG. 9 illustrates an example in which the connection establishment operations between the monitoring device 30_1 and the monitoring device 30_2 and between the monitoring device 30_3 and the controller 40 are performed first, and then the connection establishment operations between the controller 40 and the monitoring device 30_1 and between the monitoring device 30_2 and the monitoring device 30_3 are performed. However, in practice, the controller 40 and the monitoring devices 30_1, 30_2, 30_3 individually cyclically repeat the connection accepting operation and the connection requesting operation. Then, when a communication slave and a communication master that are to be paired have sent and received an advertisement packet and a connection request responding to the advertisement packet, the connection establishment operation is performed therebetween. When the controller 40 and the monitoring devices 30_1, 30_2, 30_3 have completed the connection establishment operation as communication masters firstly, the controller 40 and the monitoring devices 30_1, 30_2, 30_3 stop the connection accepting operation and continue only the connection requesting operation until completion of the connection establishment operation as communication slaves. On the other hand, when the controller 40 and the monitoring devices 30_1, 30_2, 30_3 have completed the connection establishment operation as communication slaves firstly, the controller 40 and the monitoring devices 30_1, 30_2, 30_3 stop the connection requesting operation and continue only the connection accepting operation until completion of the connection establishment operation as communication masters.

The communication connection in the operating state of the assembled battery 20, in which the controller 40 acts as the communication master and each of the monitoring devices 30_2, 30_3 acts as the communication slave, is disconnected at the latest by a start of periodic communication after a detection of turning off of the ignition switch is transmitted to each of the monitoring devices 30_2, 30_3.

The chain network illustrated in FIG. 8(b) is formed by the above-described processes performed by the controller 40 and the monitoring devices 30_1, 30_2, 30_3. In step S51 of the flowchart of FIG. 9, periodic communication is performed between the communication masters and the communication slaves in the formed chain network. However, in the periodic communication, since the assembled battery 20 is in the non-operating state, the above-described battery monitoring information need not be transmitted. The periodic communication is mainly performed to maintain the formed chain network.

In step S52, the controller 40 detects that the ignition switch is turned on as a trigger for switching from the non-operating state to the operating state of the assembled battery 20. Alternatively, the trigger for the switching from the non-operating state to the operating state of the assembled battery 20 may be detected by a fact that a user holding a smart key approaches the vehicle, a fact that a door of the vehicle is unlocked, or a fact that a driver sits on the driver's seat, for example. Upon detecting that the ignition switch is turned on, the controller 40 notifies each of the monitoring devices 30_1, 30_2, 30_3 via the chain network that the ignition switch is turned on. In other words, each of the monitoring devices 30_1, 30_2, and 30_3 is notified that the mode of the communication network needs to be changed to the star network for the operating state of the assembled battery 20.

The controller 40 acts as a communication master for each of the monitoring devices 30_1, 30_2, 30_3, and each of the monitoring devices 30_1, 30_2, 30_3 acts as a communication slave for the controller 40. Hence, the controller 40 and the monitoring devices 30_1, 30_2, 30_3 perform a connection accepting operation (scanning operation) and a connection requesting operation (advertising operation) More specifically, the controller 40 performs the connection accepting operation in step S53, and the monitoring devices 30_2, 30_3 perform the connection requesting operation in steps S54 and S55. In step S56, the connection establishment operation between the controller 40 and each of the monitoring devices 30_1, 30_2, 30_3 is performed.

Since the monitoring device 30_1 has already established a communication connection with the controller 40 serving as a communication master, the monitoring device 30_1 does not repeat the connection requesting operation. As described above, in the non-operating state of the assembled battery 20, the controller 40 maintains the communication connection with the monitoring device 30_1 while serving as the communication master. Hence, the star network in the operating state of the assembled battery 20 can be formed more promptly, and communication with each of the monitoring devices 30_1, 30_2, 30_3 can be started.

In the chain network formed in the non-operating state of the assembled battery 20, a communication connection is established between the controller 40 and the monitoring device 30_3 while the controller 40 is a communication slave and the monitoring device 30_3 is a communication master. This established communication connection may be utilized, and the roles of the communication master and the communication slave may be switched between the controller 40 and the monitoring device 30_3 instead of performing the connection accepting operation and the connection requesting operation. This roles switching may be performed if such switching of the roles of the communication master and the communication slave using the established communication connection is easier and completed more promptly than the establishment of a new communication connection by the scanning operation and the advertising operation.

The communication connections between the controller 40 and each of the monitoring devices 30_1, 30_2, 30_3 forming the chain network in the non-operating state of the assembled battery 20 is disconnected at the latest by a start of the periodic communication after a detection of turning on of the ignition switch is transmitted to each of the monitoring devices 30_1, 30_2, 30_3.

Second Embodiment

Next, a battery management system 60 according to a second embodiment will be described with reference to the drawings. The battery management system 60 according to the present embodiment is configured similarly to the battery management system 60 according to the first embodiment. Hence, description regarding the configuration of the battery management system 60 according to the present embodiment will be omitted.

Figure 10:
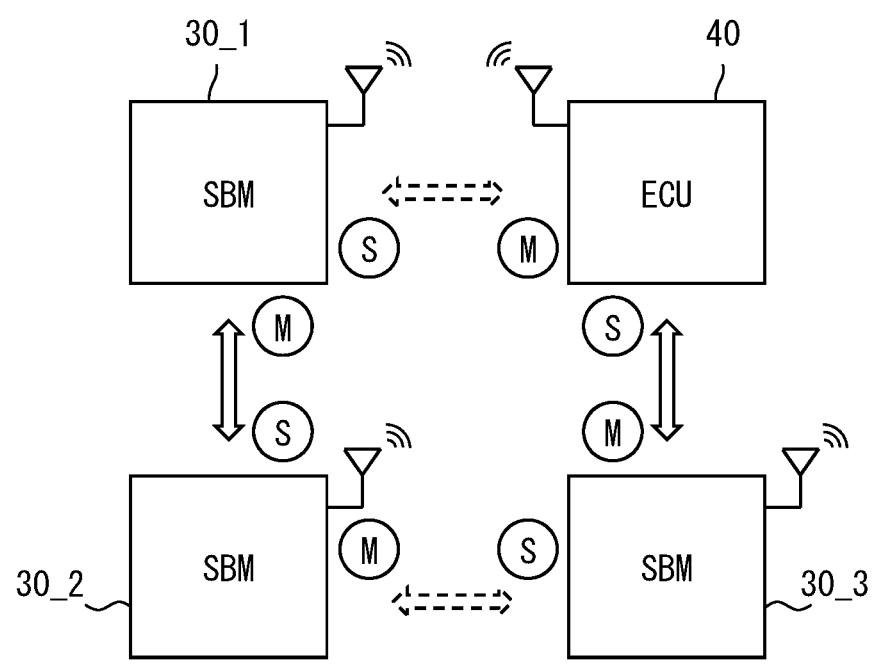
FIG. 10 is a diagram illustrating a communication mode among a controller and monitoring devices in a non-operating state of an assembled battery according to a second embodiment.

Similarly to the first embodiment, when an assembled battery 20 is in a non-operating state, the battery management system 60 according to the present embodiment switches a communication mode to a mode different from that of an operating state. Accordingly, communication between a controller 40 and monitoring devices 30 is maintained while power consumption of the controller 40 is reduced. However, unlike the first embodiment, the battery management system 60 according to the present embodiment divides master-slave pairs of devices among the controller 40 and the monitoring devices 30_1, 30_2, 30_3 into multiple groups. The divided groups sequentially perform periodic communication in a time-sharing manner. That is, a communicating group that performs communication is selected from the groups and is cyclically changed. In FIG. 10, the controller 40 and the monitoring device 30_3 form a pair, the monitoring device 30_1 and the monitoring device 30_2 form another pair, and the pairs of devices belong to one group and perform communication. In this manner, multiple master-slave pairs of devices can belong to one group.

In this way, a frequency of communication between the controller 40 and each of the monitoring devices 30_1, 30_2, 30_3 can be reduced, and power consumption of each of the devices 40, 30_1, 30_2, 30_3 can be further reduced.

Next, processes performed by the controller 40 and the monitoring devices 30_1, 30_2, 30_3 in the present embodiment will be described with reference to a flowchart of FIG. 11.

Figure 11:
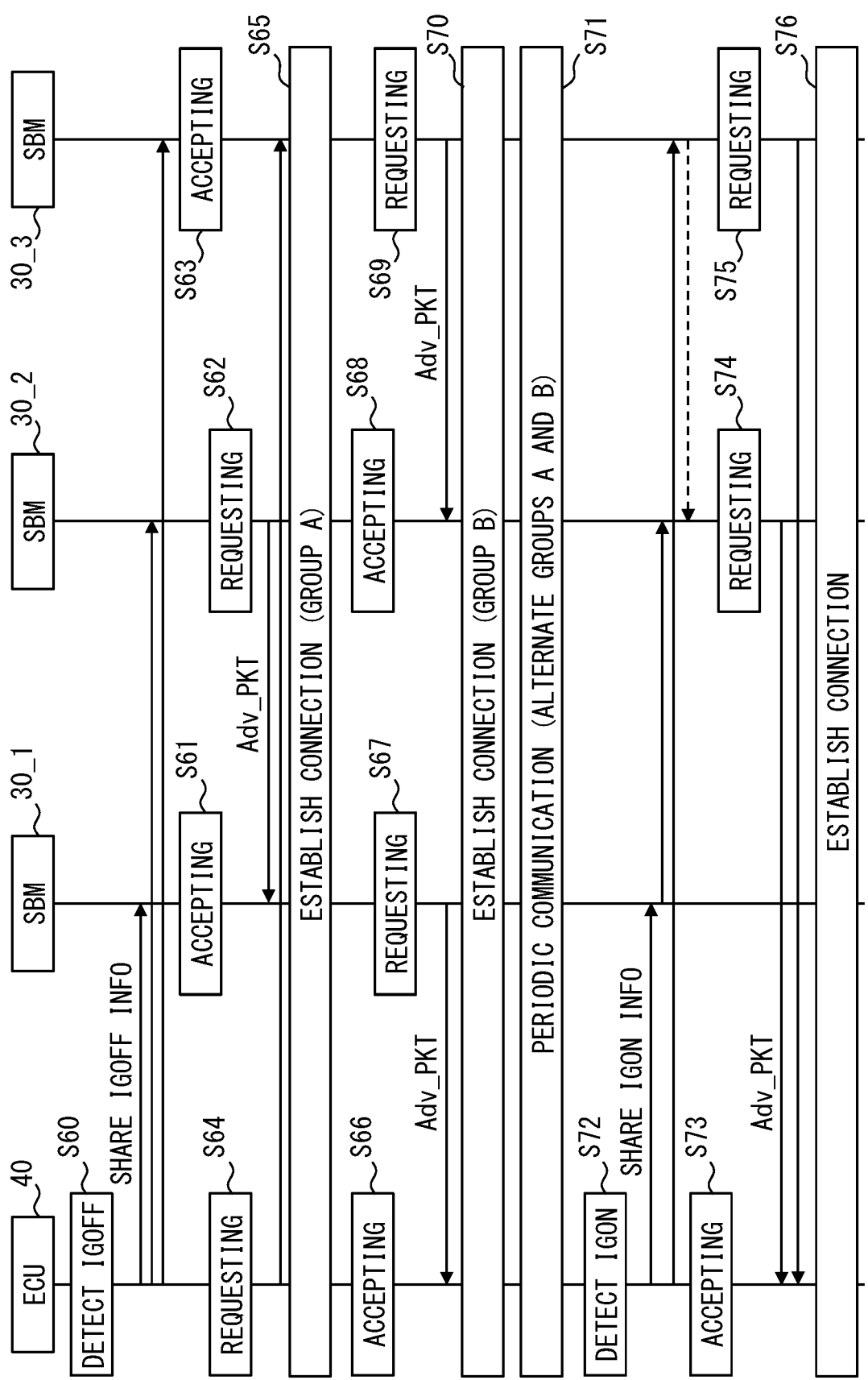
FIG. 11 is a flowchart illustrating processes in the controller and the monitoring devices according to the second embodiment.

The processes of steps S60 to S64 in the flowchart of FIG. 11 is similar to the processes of steps S40 to S44 in the flowchart of FIG. 9. In step S65, the connection establishment operations between the monitoring device 30_1 and the monitoring device 30_2 and between the monitoring device 30_3 and the controller 40 are performed. A pair formed of the monitoring device 30_1 acting as a communication master and the monitoring device 30_2 acting as a communication slave, and a pair formed of the monitoring device 30_3 acting as a communication master and the controller 40 acting as a communication slave belong to a group A.

The processes of steps S66 to S69 in the flowchart of FIG. 11 is similar to the processes of steps S46 to S49 in the flowchart of FIG. 9. In step S70, the connection establishment operations between the controller 40 and the monitoring device 30_1 and between the monitoring device 30_2 and the monitoring device 30_3 are performed. A pair formed of the controller 40 acting as a communication master and the monitoring device 30_1 acting as a communication slave of, and a pair formed of the monitoring device 30_2 acting as a communication master and the monitoring device 30_3 acting as a communication slave belong to a group B.

In the flowchart of FIG. 11, for the sake of convenience, the pairs belonging to the group A, i.e. the pair formed of the monitoring device 30_1 acting as the communication master and the monitoring device 30_2 acting as the communication slave and the pair formed of the monitoring device 30_3 acting as the communication master and the controller 40 acting as the communication slave perform the connection establishment operation first. And then, the pairs belonging to the group B, i.e. the pair formed of the controller 40 acting as the communication master and the monitoring device 30_1 acting as the communication slave and the pair formed of the monitoring device 30_2 acting as the communication master and the monitoring device 30_3 acting as the communication slave perform the connection establishment operation. However, as described in the first embodiment, in practice, the controller 40 and the monitoring devices 30_1, 30_2, 30_3 individually cyclically repeat the connection accepting operation and the connection requesting operation. Then, when a communication slave and a communication master that are to be paired have sent and received an advertisement packet and a connection request responding to the advertisement packet, the connection establishment operation is performed therebetween. When all the connection establishment operations are completed, the pairs belonging to the group A perform synchronous communication, and the pairs belonging to the group B perform synchronous communication at a timing different from that of the group A. That is, in the periodic communication in step S71, communication by the master-slave pairs belonging to the group A and communication by the master-slave pairs belonging to the group B are alternately performed.

It may be set in advance which group the above-described master-slave pairs belong to. The controller 40 or one of the monitoring devices 30_1, 30_2, 30_3 may group the devices according to charge amounts of the battery stacks 21 monitored by the monitoring devices 30_1, 30_2, 30_3. When the monitoring devices 30_1, 30_2, 30_3 are grouped according to the charge amounts of the battery stacks 21, pairs in which a communication master is the monitoring device 30 (highly-charged monitoring device) monitoring the battery stack 21 having a relatively high charge amount may belong to the same group (referred to as "highly charged group"), and pairs in which a communication master is the monitoring device 30 (lowly-charged monitoring device) monitoring the battery stack 21 having a relatively low charge amount may belong to the same group (referred to as "lowly charged group"). Furthermore, the controller 40 or one of the monitoring devices 30_1, 30_2, 30_3 may manage the cyclic changing of the communicating group such that, in periodic communication, a frequency of communication in the highly charged group becomes higher than a frequency of communication in the lowly charged group.

Electric power consumed in communication with a communication partner is higher in the communication master than the communication slave. Thus, such increase in frequency of communication as the communication master can result in balancing (i.e. equalization) of the charge amounts of the battery stacks 21.

In order to increase the frequency of communication in the highly charged group, for example, the controller 40 or one of the monitoring devices 30_1, 30_2, 30_3 may manage the cyclic changing of the communicating group such that a communication period of the highly charged group becomes longer than a communication period of the lowly charged group.

Alternatively, for example, the controller 40 or one of the monitoring devices 30_1, 30_2, 30_3 may manage the cyclic changing of the communicating group such that a frequency of selection of the highly charged group as the communicating group becomes higher than a frequency of selection of the lowly charged group as the communicating group. Specifically, the cyclic changing of the communicating group may be managed such that the number of times the highly charged group is selected as the communicating group is larger than the number of times the lowly charged group is selected as the communicating group.

Third Embodiment

Next, a battery management system 60 according to a third embodiment will be described with reference to the drawings. The battery management system 60 according to the present embodiment is configured similarly to the battery management system 60 according to the first embodiment. Hence, description regarding the configuration of the battery management system 60 according to the present embodiment will be omitted.

Figure 12:
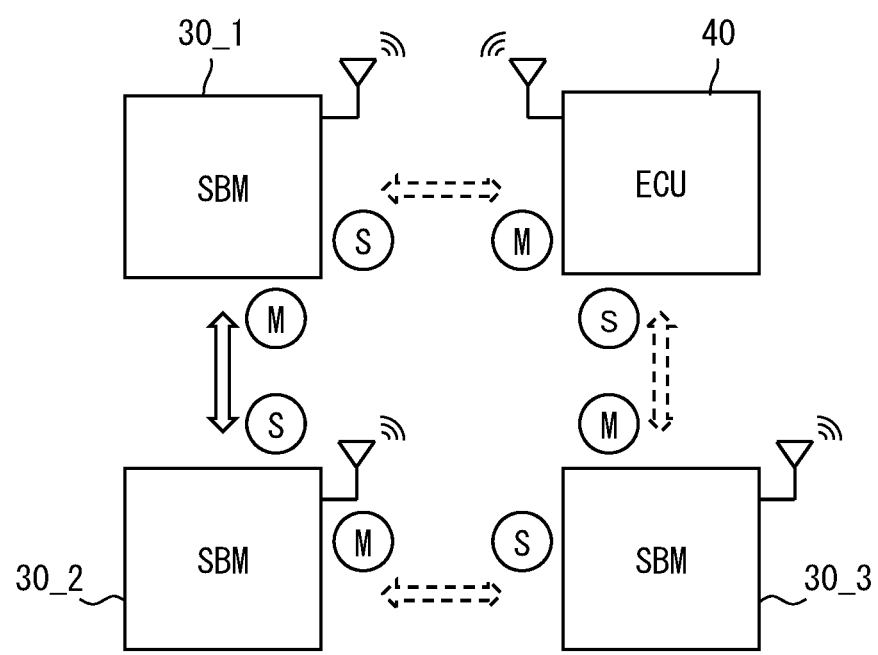
FIG. 12 is a diagram illustrating a communication mode among a controller and monitoring devices in a non-operating state of an assembled battery according to a third embodiment.

Similarly to the second embodiment, the battery management system 60 according to the present embodiment divides master-slave pairs of devices among a controller 40 and monitoring devices 30_1, 30_2, 30_3 into groups. The divided groups sequentially perform periodic communication in a time-sharing manner. In the present embodiment, as illustrated in FIG. 12, the number of master-salve pairs belonging to each group for performing communication is smaller than that in the second embodiment. As a result, the electric power consumed by the controller 40 and each of the monitoring devices 30_1, 30_2, 30_3 through communication can be further reduced.

Next, processes performed by the controller 40 and each of the monitoring devices 30_1, 30_2, 30_3 in the present embodiment will be described with reference to a flowchart of FIG. 13.

Figure 13:
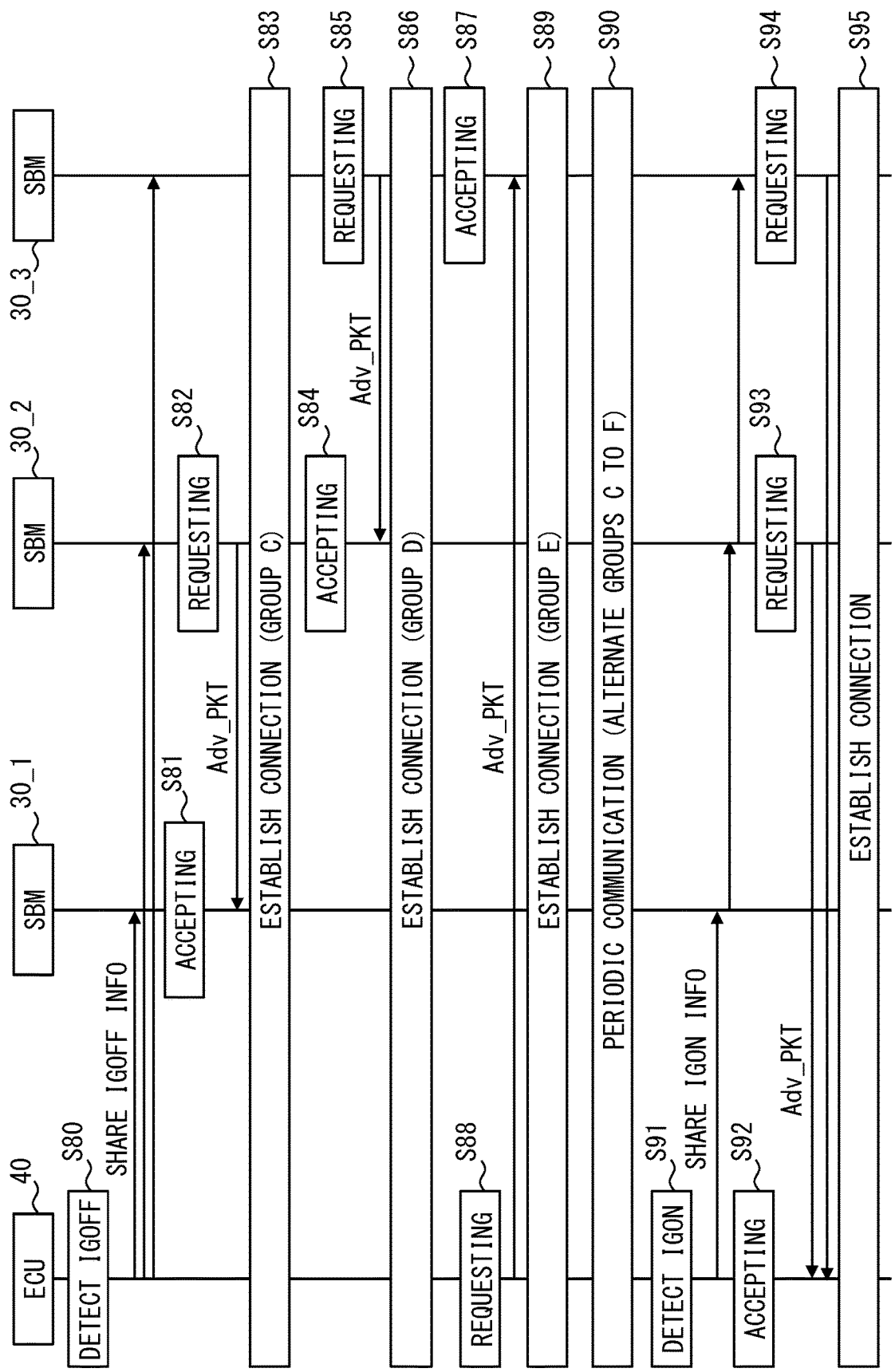
FIG. 13 is a flowchart illustrating processes in the controller and the monitoring devices according to the third embodiment.

The process of step S80 in the flowchart of FIG. 13 is similar to the process of step S40 in the flowchart of FIG. 9. In step S81, the monitoring device 30_1 performs a connection accepting operation to act as a communication master for the monitoring device 30_2. In step S82, the monitoring device 30_2 performs a connection requesting operation to act as a communication slave for the monitoring device 30_1. In step S83, a connection establishment operation between the monitoring device 30_1 and the monitoring device 30_2 is performed. At this time, a pair formed of the monitoring device 30_1 acting as a communication master and the monitoring device 30_2 acting as a communication slave belongs to a group C.

In step S84, the monitoring device 30_2 performs a connection accepting operation to act as a communication master for the monitoring device 30_3. In step S85, the monitoring device 30_3 performs a connection requesting operation to act as a communication slave for the monitoring device 30_2. In step S86, a connection establishment operation between the monitoring device 30_2 and the monitoring device 30_3 is performed. At this time, a pair formed of the monitoring device 30_2 acting as a communication master and the monitoring device 30_3 acting as a communication slave belongs a group D.

In step S87, the monitoring device 30_3 performs a connection accepting operation to act as a communication master for the controller 40. In step S88, the controller 40 performs a connection requesting operation to act as a communication slave for the monitoring device 30_3. The connection accepting operation and the connection requesting operation may be replaced with a process of switching the function of the communication master and the function of the communication slave. In step S89, a connection establishment operation between the monitoring device 30_3 and the controller 40 is performed. At this time, a pair formed of the monitoring device 30_3 acting as a communication master and the controller 40 acting as a communication slave belongs to a group E.

A communication connection between a pair formed of the controller 40 acting as a communication master and the monitoring device 30_1 acting as a communication slave has already been established. This pair belongs to a group F. As described above, an order of the connection establishment operations performed by the controller 40 and the monitoring devices 30_1, 30_2, 30_3 is not limited to the example illustrated in the flowchart of FIG. 13.

In the periodic communication in step S90, the master-slave pairs belonging to the groups C to F perform communication in a predetermined order. At this time, similarly to the second embodiment, the controller 40 or one of the monitoring devices 30_1, 30_2, 30_3 may manage the cyclic changing of the communicating group such that, in periodic communication, a frequency of communication in the group of the pairs in which the communication master is the monitoring device 30 monitoring a battery stack 21 having a relatively high charge amount becomes higher than a frequency of communication in the group of the pairs in which the communication master is the monitoring device 30 monitoring the battery stack 21 indicating a having low charge amount.

Other Embodiments

The disclosure in this specification, the drawings, and the like is not limited to the exemplified embodiments. The disclosure encompasses the illustrated embodiments and variations thereof by those skilled in the art. For example, the disclosure is not limited to the parts and/or combinations of elements shown in the embodiments. The disclosure is feasible by various combinations. The disclosure can have additional portions that can be added to the embodiments. The present disclosure encompasses the embodiments where some components and/or elements are omitted. The present disclosure encompasses replacement or combination of components and/or elements between one embodiment and another. The disclosed technical scope is not limited to the description of the embodiments. The several technical scopes disclosed are indicated by the description of the claims, and should be further understood to include meanings equivalent to the description of the claims and all modifications within the scope.

When an element or layer is referred to as being "on," "coupled," "connected," or "combined," it may be directly on, coupled, connected, or combined to the other element or layer, or further, intervening elements or layers may be present. In contrast, when an element is referred to as being "directly on," "directly coupled to," "directly connected to," or "directly combined with" another element or layer, there are no intervening elements or layers present. Other terms used to describe the relationship between elements should be interpreted in a similar manner (e.g., "between" and "directly between," "adjacent" and "directly adjacent," and the like). As used herein, the term "and/or" includes any combination and all combinations relating to one or more of the related listed items. For example, the term A and/or B includes only A, only B, or both A and B.

Spatially relative terms such as "inner," "outer," "back," "below," "low," "above," and "high" are utilized herein to facilitate description of one element or feature's relationship to another element (s) or feature (s) as illustrated. Spatially relative terms are intended to include different orientations of the device in use or in operation in addition to the orientation depicted in the drawings. For example, when a device in a drawing is turned over, elements described as "below" or "directly below" other elements or features are oriented "above" the other elements or features. Therefore, the term "below" can include both above and below. The device may be oriented in the other direction (rotated 90 degrees or in any other direction) and the spatially relative terms used herein are interpreted accordingly.

The device, the system, and the method thereof described in the present disclosure may be implemented by a special purpose computer forming a processor programmed to execute one or more particular functions embodied in computer programs. Alternatively, the device and its method described in the present disclosure may be fully implemented by special purpose logical hardware logic circuits. Alternatively, the device and the method thereof described in the present disclosure may be implemented by one or more special purpose computers formed by a combination of a processor that executes computer programs and one or more hardware logic circuits. The computer program may be stored in a computer-readable non-transition tangible recording medium as an instruction executed by a computer.

For example, an example in which the monitoring device 30 includes the microcontroller 34 has been described, but the present disclosure is not limited thereto. A battery management system 60 in which a monitoring device 30 does not include the microcontroller 34 may be adopted. In this configuration, the wireless IC 35 transmits and receives data to and from the monitoring IC 33. The wireless IC 35 may execute the sensing by the monitoring IC 33 and the schedule control of the self-diagnosis, or the main microcontroller 45 of the controller 40 may execute the sensing and the schedule control.

An example of arranging the monitoring device 30 for each of the respective battery stacks 21 has been shown, but the present disclosure is not limited thereto. For example, one monitoring device 30 may be arranged for multiple battery stacks 21. Multiple monitoring devices 30 may be arranged for one battery stack 21.

While the example in which the battery pack 11 includes one controller 40 has been described, the present invention is not limited thereto. The battery pack 11 may include multiple controllers 40. An example has been described in which the monitoring device 30 includes one monitoring IC 33, but the present disclosure is not limited thereto. The monitoring device 30 may include multiple monitoring ICs 33. In this case, the wireless IC 35 may be provided for each of the monitoring ICs 33, or one wireless IC 35 may be provided for the multiple monitoring ICs 33.

The arrangement and number of the battery stacks 21 and the battery cells 22 constituting the assembled battery 20 are not limited to the above example. In the battery pack 11, the arrangement of the monitoring device 30 and/or the controller 40 is not limited to the above example.

In each of the embodiments described above, the monitoring system of the present disclosure is embodied as a battery management system 60 configured to monitor each battery stack 21 of the assembled battery 20. However, the monitoring system according to the present disclosure can also be used for monitoring a monitored target other than each battery stack 21 of the assembled battery 20. For example, the monitoring system according to the present disclosure may be embodied as a system that wirelessly communicates with a pneumatic sensor unit incorporated in each wheel of a vehicle to monitor each pneumatic sensor unit. In this case, each monitoring device is provided on each wheel, and at least one controller is provided inside the vehicle.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A monitoring system comprising:
   monitoring devices provided in a monitored device and monitoring the monitored device; and
   a controller configured to wirelessly communicate with the monitoring devices to acquire monitoring information of the monitored device from the monitoring devices, wherein
   the monitored device is switchable between an operating state and a non-operating state,
   in the operating state of the monitored device, the controller and the monitoring devices establish individual connections in which the controller acting as a communication master performs wireless communication with each of the monitoring devices acting as communication slaves, and
   in the non-operating state of the monitored device, the controller and the monitoring devices maintain communication between the controller and the monitoring devices by establishing a sequential connection in which:
   the controller acting as a communication master performs wireless communication with one of the monitoring devices acting as a communication slave; and
   one of the monitoring devices, in sequence, acting as a communication master performs wireless communication with another one of the monitoring devices acting as a communication slave.

2. The monitoring system according to claim 1, wherein the controller operates by being supplied with power from a power supply different from a power supply that supplies power to the monitoring devices.

3. The monitoring system according to claim 1, wherein in response to an instruction on switching from the operating state to the non-operating state of the monitored device, the controller continues to act as the communication master for one of the monitoring devices by maintaining one of the individual connections.

4. The monitoring system according to claim 1, wherein in the non-operating state of the monitored device, the controller acts as the communication master for one of the monitoring devices and acts as a communication slave for one of the monitoring devices acting as a communication master.

5. The monitoring system according to claim 4, wherein in response to an instruction on switching from the operating state to the non-operating state of the monitored device, the controller becomes the communication slave for one of the monitoring devices by swapping of roles between the controller acting as the communication master and one of the monitoring devices acting as the communication slaves in one of the individual connections.

6. The monitoring system according to claim 1, wherein in response to an instruction on switching from the non-operating state to the operating state of the monitored device, the controller and the monitoring devices maintain a part of the sequential connection between the controller acting as the communication master and one of the monitoring devices acting as the communication slave, and establish individual connections between the controller and each of remaining ones of the monitoring devices.

7. The monitoring system according to claim 4, wherein in response to an instruction on switching from the non-operating state to the operating state of the monitored device, the controller becomes the communication master for one of the monitoring devices by swapping of roles between the controller acting as the communication slave and one of the monitoring devices acting as the communication master in the sequential connection.

8. The monitoring system according to claim 6, wherein the instruction on switching from the non-operating state to the operating state of the monitored device is directly or indirectly transmitted from the controller to each of the monitoring devices via the sequential connection maintained in the non-operating state of the monitored device.

9. The monitoring system according to claim 1, wherein in the non-operating state of the monitored device, master-slave pairs that are each formed of a communication master and a communication slave among the controller and the monitoring devices belong to any one of groups, a communicating group that performs communication therein is selected from the groups and is changed cyclically among the groups.

10. The monitoring system according to claim 9, wherein each of the groups includes more than two of the master-slave pairs.

11. The monitoring system according to claim 9, wherein:

the monitored device is an assembled battery including battery stacks;

the monitoring devices are configured to monitor the battery stacks, respectively, and each supplied with power from corresponding one of the battery stacks to be monitored; and when the monitoring devices detect an imbalance in charge amounts of the battery stacks:

the monitoring devices include a highly-charged monitoring device that monitors a battery stack having a relatively high charge amount, and a lowly-charged monitoring device that monitors a battery stack having a relatively low charge amount; and the controller or one of the monitoring devices manages the cyclic changing of the communicating group such that a frequency of communication by the highly-charged monitoring device as the communication master becomes higher than a frequency of communication by the lowly-charged monitoring device as the communication master.

12. The monitoring system according to claim 11, wherein the controller or one of the monitoring devices manages the cyclic changing of the communicating group such that a period of communication in a group to which the highly-charged monitoring device belongs is longer than a period of communication in a group to which the lowly-charged monitoring device belongs.

13. The monitoring system according to claim 11, wherein the controller or one of the monitoring devices manages the cyclic changing of the communicating group such that a frequency of selection of a group to which the highly-charged monitoring device belongs as the communicating group is higher than a frequency of selection of a group to which the lowly-charged monitoring device belongs as the communicating group.

* * * * *